US008114775B2

(12) United States Patent
Siddiqui et al.

(10) Patent No.: US 8,114,775 B2
(45) Date of Patent: Feb. 14, 2012

(54) DIHYDROXY ENOL COMPOUNDS USED IN CHEMICAL MECHANICAL POLISHING COMPOSITIONS HAVING METAL ION OXIDIZERS

(75) Inventors: Junaid Ahmed Siddiqui, Richmond, VA (US); Daniel Hernandez Castillo, Laveen, AZ (US); Steven Masami Aragaki, Kawasaki (JP); Robin Edward Richards, Salt Lake City, UT (US)

(73) Assignee: DuPont Air Products Nanomaterials, LLC, Tempe, AZ (US)

( * ) Notice: Subject to any disclaimer, the term of this patent is extended or adjusted under 35 U.S.C. 154(b) by 334 days.

(21) Appl. No.: 12/352,700

(22) Filed: Jan. 13, 2009

(65) Prior Publication Data
US 2009/0308836 A1     Dec. 17, 2009

Related U.S. Application Data

(63) Continuation of application No. 11/387,934, filed on Mar. 24, 2006, now Pat. No. 7,476,620.

(60) Provisional application No. 60/674,678, filed on Apr. 26, 2005, provisional application No. 60/664,930, filed on Mar. 25, 2005.

(51) Int. Cl.
    *H01L 21/302* (2006.01)
(52) U.S. Cl. .................. 438/692; 438/693; 216/89
(58) Field of Classification Search .................. 438/690, 438/691, 92, 693; 257/79.1, 79.5; 216/89
    See application file for complete search history.

(56) References Cited

U.S. PATENT DOCUMENTS 3,293,093 A    12/1966  Jones et al. ............... 156/18
4,769,073 A     9/1988  Tastu et al. ................ 106/3
(Continued)

FOREIGN PATENT DOCUMENTS
EP         1 118 647         7/2001
(Continued)

OTHER PUBLICATIONS

"Mechanistic Aspects of Chemical Mechanical Polishing of LTungsten Using Ferric Ion Based Alumina Slurries" by Raghunath et al., Electrochemical Society Proceedings, vol. 96-22, 1997.

*Primary Examiner* — Duy Deo
*Assistant Examiner* — Erin Flanagan
(74) *Attorney, Agent, or Firm* — John R. Dodd; Geoffrey L. Chase

(57) ABSTRACT

A chemical mechanical polishing composition contains 1) water, 2) optionally an abrasive material, 3) an oxidizer, preferably a per-type oxidizer, 4) a small amount of soluble metal-ion oxidizer/polishing accelerator, a metal-ion polishing accelerator bound to particles such as to abrasive particles, or both; and 5) at least one of the group selected from a) a small amount of a chelator, b) a small amount of a dihydroxy enolic compound, and c) a small amount of an organic accelerator. Ascorbic acid in an amount less than 800 ppm, preferably between about 100 ppm and 500 ppm, is the preferred dihydroxy enolic compound. The polishing compositions and processes are useful for substantially all metals and metallic compounds found in integrated circuits, but is particularly useful for tungsten. The present invention also pertains to surface-modified colloidal abrasive polishing compositions and associated methods of using these compositions, particularly for chemical mechanical planarization, wherein the slurry comprises low levels of chelating free radical quenchers, non-chelating free radical quenchers, or both.

11 Claims, 2 Drawing Sheets

U.S. PATENT DOCUMENTS

| | | | | |
|---|---|---|---|---|
| 4,959,113 | A | 9/1990 | Roberts | 387/474 |
| 5,354,490 | A | 10/1994 | Yu et al. | 252/79.1 |
| 5,527,423 | A | 6/1996 | Neville et al. | 156/636.1 |
| 5,700,383 | A | 12/1997 | Feller et al. | 216/88 |
| 5,759,917 | A | 6/1998 | Grover et al. | 438/690 |
| 5,858,813 | A | 1/1999 | Scherber et al. | 438/693 |
| 5,916,855 | A | 6/1999 | Avanzino et al. | 57/307 |
| 5,958,288 | A | 9/1999 | Mueller et al. | 252/186.1 |
| 5,980,775 | A | 11/1999 | Grumbine et al. | 252/79.1 |
| 5,981,454 | A | 11/1999 | Small | 510/175 |
| 6,068,787 | A | 5/2000 | Grumbine et al. | 252/79.1 |
| 6,083,419 | A | 7/2000 | Grumbine et al. | 252/79.1 |
| 6,117,220 | A | 9/2000 | Kodama et al. | 106/3 |
| 6,136,711 | A | 10/2000 | Grumbine et al. | 438/692 |
| 6,156,661 | A | 12/2000 | Small | 438/692 |
| 6,258,140 | B1 | 7/2001 | Shemo et al. | 51/308 |
| 6,326,305 | B1 | 12/2001 | Avanzino et al. | 257/306 |
| 6,348,440 | B1 | 2/2002 | Meskers, Jr. et al. | 510/253 |
| 6,383,065 | B1 | 5/2002 | Grumbine et al. | 451/526 |
| 6,399,492 | B1 | 6/2002 | Andreas et al. | 438/682 |
| 6,423,125 | B1 | 7/2002 | Ishibashi et al. | 106/3 |
| 6,448,182 | B1 | 9/2002 | Hall et al. | 438/692 |
| 6,464,568 | B2 | 10/2002 | Miller et al. | 451/41 |
| 6,491,837 | B1 | 12/2002 | Liu et al. | 216/89 |
| 6,492,308 | B1 | 12/2002 | Naghshineh et al. | 510/175 |
| 6,508,953 | B1 | 1/2003 | Li et al. | 252/79.1 |
| 6,527,622 | B1 | 3/2003 | Brusic et al. | 451/28 |
| 6,541,384 | B1 | 4/2003 | Sun et al. | 438/692 |
| 6,546,939 | B1 | 4/2003 | Small | 134/1.3 |
| 6,589,100 | B2 | 7/2003 | Moeggenborg et al. | 451/41 |
| 6,604,987 | B1 | 8/2003 | Sun | 451/41 |
| 6,620,215 | B2 | 9/2003 | Li et al. | 51/298 |
| 6,632,377 | B1 | 10/2003 | Brusic et al. | 252/79.1 |
| 6,635,562 | B2 | 10/2003 | Andreas | 438/633 |
| 6,645,051 | B2 | 11/2003 | Sugiyama et al. | 451/41 |
| 6,656,021 | B2 | 12/2003 | Ota et al. | 451/41 |
| 6,656,022 | B2 | 12/2003 | Ota et al. | 451/41 |
| 6,660,639 | B2 | 12/2003 | Li et al. | 438/692 |
| 6,689,692 | B1 | 2/2004 | Grover et al. | 438/691 |
| 6,692,632 | B1 | 2/2004 | Bremner et al. | 205/413 |
| 6,702,954 | B1 | 3/2004 | Her et al. | 252/79.1 |
| 6,723,691 | B2 | 4/2004 | Naghshineh et al. | 510/175 |
| 6,743,267 | B2 | 6/2004 | Jernakoff et al. | 51/307 |
| 6,752,844 | B2 | 6/2004 | Miller et al. | 51/307 |
| 6,758,872 | B2 | 7/2004 | Ota et al. | 51/307 |
| 6,783,434 | B1 | 8/2004 | Akahori et al. | 451/41 |
| 6,786,945 | B2 | 9/2004 | Machii et al. | 51/307 |
| 6,797,624 | B2 | 9/2004 | Lee | 438/692 |
| 6,806,193 | B2 | 10/2004 | Korthuis et al. | 438/692 |
| 2003/0041526 | A1* | 3/2003 | Fujii et al. | 51/307 |
| 2003/0082101 | A1 | 5/2003 | Taylor et al. | 424/11.1 |
| 2003/0098434 | A1 | 5/2003 | Li et al. | 252/62 |
| 2003/0114083 | A1 | 6/2003 | Jernakoff et al. | 451/28 |
| 2003/0119319 | A1* | 6/2003 | Sinha et al. | 438/691 |
| 2003/0162398 | A1 | 8/2003 | Small et al. | 438/692 |
| 2003/0224958 | A1* | 12/2003 | Andreas | 510/202 |
| 2004/0006924 | A1 | 1/2004 | Scott et al. | 51/307 |
| 2004/0029495 | A1 | 2/2004 | Small et al. | 451/41 |
| 2004/0107650 | A1 | 6/2004 | Siddiqui et al. | 51/307 |
| 2004/0134873 | A1 | 7/2004 | Yao et al. | 216/2 |
| 2004/0140288 | A1 | 7/2004 | Patel et al. | 216/2 |
| 2004/0266183 | A1 | 12/2004 | Miller et al. | 210/321.8 |
| 2005/0003744 | A1 | 1/2005 | Feng et al. | 451/41 |
| 2005/0067378 | A1 | 3/2005 | Fuerhaupter et al. | 216/34 |
| 2005/0155296 | A1 | 7/2005 | Siddiqui | 51/307 |
| 2005/0208883 | A1 | 9/2005 | Yoshida et al. | 451/41 |
| 2006/0024967 | A1* | 2/2006 | De Rege Thesauro et al. | 438/692 |
| 2006/0117667 | A1* | 6/2006 | Siddiqui et al. | 51/309 |
| 2006/0281196 | A1* | 12/2006 | Feeney et al. | 438/5 |

FOREIGN PATENT DOCUMENTS

| | | |
|---|---|---|
| GB | 2 375116 | 11/2002 |
| WO | WO99/53532 | 10/1999 |

* cited by examiner

DIHYDROXY ENOL COMPOUNDS USED IN CHEMICAL MECHANICAL POLISHING COMPOSITIONS HAVING METAL ION OXIDIZERS

RELATED APPLICATIONS

This application is a continuation application of U.S. patent application Ser. No. 11/387,934, filed on Mar. 24, 2006, now U.S. Pat. No. 7,476,620 which claims priority to provisional U.S. applications 60/664,930 filed on Mar. 25, 2005, and 60/674,678 filed on Apr. 26, 2005, the entire contents of which are each individually incorporated herein for all purposes by express reference thereto. Further, for the U.S. application only, this application additionally claims priority to co-assigned and application Ser. No. 10/689,043 filed on Oct. 21, 2003 which published as U.S. application 20040134873, now abandoned; to co-assigned application Ser. No. 10/361,822 filed on Feb. 11, 2003 which published as U.S. application 20040140288, now U.S. Pat. No. 7,029,508; and to co-assigned application Ser. No. 10/759,666 filed on Jan. 16, 2004, now U.S. Pat. No. 7,077,880; the entire contents of which are each individually incorporated herein for all purposes by express reference thereto.

FIELD OF THE INVENTION

The present invention pertains to chemical mechanical polishing or electrochemical polishing wherein the polishing composition contains 1) water, 2) optionally an abrasive material, 3) an oxidizer, preferably a per-type oxidizer, 4) a small amount of soluble metal-ion oxidizer/polishing accelerator, a metal-ion polishing accelerator bound to particles such as to abrasive particles, or both; and 5) at least one of the group selected from a) a small amount of a chelator, b) a small amount of a dihydroxy enolic compound, and c) a small amount of an organic accelerator. The polishing compositions and processes are useful for substantially all metals and metallic compounds found in integrated circuits, but is particularly useful for tungsten. The present invention also pertains to surface-modified colloidal abrasive polishing compositions and associated methods of using these compositions, particularly for chemical mechanical planarization, wherein the slurry comprises low levels of chelating free radical quenchers, non-chelating free radical quenchers, or both

BACKGROUND OF THE INVENTION

Chemical mechanical polishing ("CMP") and electrochemical polishing ("ECP") are often employed in manufacturing of substrates such as semiconductor wafers or integrated circuits having excess metal deposited on a surface, to remove the excess metal from the surface of the substrate at one or more stages in the manufacturing process. In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Electrochemical polishing involves substantially the same materials and procedures, but also includes imposing an electric potential (and also typically electric current) between a substrate and an anode. The substrate surface to be polished includes metal and, at least when the polishing process is through, a dielectric material. Semiconductor fabrication processes such as photolithography have evolved significantly, such that advanced devices having very fine oxide, metal, and other surface features, with sub-0.18 micron geometries, are now being made. Process tolerances are necessarily tighter for these advanced devices, calling for improvements in CMP technology to obtain desired material removal rates while minimizing wafer defects or damage. It is highly important that the surface be planarized, that conductors not be over-polished, and that metal ion contamination of the dielectric be minimized.

Economic forces are requiring faster manufacturing processes. One approach to increasing polishing rates involved increasing the downward pressure on the wafer carrier in order to increase material removal rates. This approach is no longer used as the requisite downward pressure is too likely to cause wafer damage, such as scratching, delamination, or destruction of material layers on the wafer. Another approach is using larger and/or rougher abrasives, but the defectivity of the wafers is too high. Another approach has involved increasing the amount of oxidizing agent used. This approach is disfavored as the use of increased amounts of oxidizing agents increases material costs and also adds to the handling issues and environmental issues associated with disposing used slurries.

Additional approaches have involved using various combinations of one or more abrasives including various types of abrasives, sizes of abrasives, shapes of abrasives, size distribution of abrasives, and even BET surface area of abrasives, one or more oxidizers, one or more chelators, one or more corrosion inhibitors, one or more solvents, one or more wettability modifiers, one or more rheology modifiers, one or more abrasive particle modifiers, and other chemicals in the slurry. Some combinations include materials which alone or in the combination have short shelf lives, even to the point of requiring using point-of-use mixing techniques, and these combinations are generally disfavored, as they typically complicate CMP in terms of tooling and process control for example, consume more process time, and/or increase costs.

Typical abrasives include ceria, silica, and alumina, though a wide variety of abrasives are known to those of ordinary skill in the art. Modified abrasives are known—see for example co-owned U.S. Pat. No. 6,743,267, the disclosure of which is incorporated herein by reference thereto, which discloses colloidal ceria or silica abrasive that has been modified with boron-containing compound(s).

In order to achieve fast metal removal rates in a CMP and/or ECP process, a variety of combinations of co-oxidants have been produced. Literally dozens of oxidants have been tested (see, e.g., U.S. Pat. No. 5,958,288 for a partial listing), but only periodic acid, hydroxylamine, ferric nitrate, persulfates (including e.g., peroxydisulfates), urea hydrogen peroxide, peracetic acid, aluminum salts, cerium salts, and hydrogen peroxide ("H2O2") are commonly used. U.S. Pat. No. 4,959,113 claims CMP slurries having synergistic combinations of two or more salts where the cations are selected from ionized elements (i.e., metals) which will not deposit by electroless plating on the metal surface being polished. Metal ion oxidizers create excessive metal ion contamination problems. Historically, only transition metal salts were thought to be problematic, as sodium, potassium, and lithium have a much lower tendency to contaminate dielectric surfaces. Now that the size of features has gotten so small, even sodium and potassium are recognized as problems, though still not as severe as transition metal contamination. While it is advantageous to minimize sodium and potassium, as used herein, "metals" only means transitional metals and rare earth metals. Lithium, sodium, and potassium are not treated as metals with respect to the claims.

There are a large number of soluble metal oxidizers in use despite the issue of metal ion contamination of a substrate. There are a number of CMP slurries that have small amounts of soluble metal oxidizers. U.S. Pat. No. 5,084,071 described a CMP slurry which contained abrasive particles and a transition metal chelated salt (e.g. EDTA) as a polishing accelerator. Recent patents that disclose CMP slurries having a small amount of soluble transitional metal salts, typically iron salts, which function as oxidizers or polishing accelerators include: U.S. Pat. Nos. 6,491,837, 6,632,377, 6,541,384, and the like. There are scores of references that teach polishing with a CMP composition comprising one or more transitional metal salts, typically ferric salts, but less often aluminum and other salts, in concentrations that intersect the limits of our invention as described in the claims. There is also a growing interest in CMP slurries comprising very small concentrations of soluble rare earth metal salts, typically cerium salts. Such slurries have long been known to be useful in polishing glass—U.S. Pat. No. 4,769,073 describes a CMP slurry for organic glasses having particulate ceric oxide and at least 0.2% by weight of a water soluble cerous (III) salt based on the weight of ceric oxide. Such CMP slurries now find use both in polishing particular metal surfaces and also in polishing dielectric surfaces. Patents that describe CMP slurries having a small amount of soluble rare earth salts include: U.S. Pat. Nos. 6,797,624, 6,399,492, 6,752,844, and 5,759,917.

Of all the oxidants in commercial use, hydrogen peroxide is particularly preferred because of its low cost, and it is benign from the standpoint of product stewardship, as the byproduct is water. Organic oxidizers such as peroxides, hydroxylamines, periodates, persulfates, and the like are prone to lose strength over time, thereby adding a complicating factor to anticipated polishing rates, and ultimately affecting shelf life and bath life. Also, often a straight organic oxidizer is a poor oxidant for selected metals, e.g., hydrogen peroxide for tungsten. The industry has incorporated additives, especially a small amount of soluble metal salt oxidizers, increase the tungsten removal rate during CMP with hydrogen peroxide. There are a number of patents which mention or direct combining organic oxidizers with metal salt oxidizers, and they usually teach minimizing soluble metal ions. U.S. Pat. No. 3,293,093, which is directed to hydrogen peroxide-based etching solutions for copper, states that copper ions, "form active metal ions which have been found to have a highly depreciating effect on hydrogen peroxide (so) that it is rapidly exhausted" These investigators noted that a "catalytic amount" of silver ions, and preferably also a small amount of phenacetin, gave "exceptionally fast etch rates significantly greater than when either additive is used alone." The patent taught "as little as 10 parts per million" of silver ions is effective, and "about 50-500 parts per million of free silver ion generally represents the preferred amount."

Other exemplary patents that describe CMP compositions having organic oxidizers (usually per-type oxidizers) and soluble metal oxidizer salts which function as polishing accelerators include: 1) U.S. Pat. No. 5,354,490; 2) U.S. Pat. No. 5,527,423; 3) U.S. Pat. Nos. 5,958,288, 5,980,775, 6,068, 787, 6,083,419, 6,136,711, 6,383,065, and 6,527,622; 4) SU 1629353 describes a CMP composition for aluminum alloys containing iron chloride and sodium perborate in the presence of diethyldithiophosphoric acid and ninhydrin; 5) WO 99/53532; 6) U.S. Pat. No. 6,604,987; 7) U.S. Pat. No. 6,783, 434; 8) U.S. Pat. No. 5,916,855; 9) U.S. Pat. Nos. 6,689,692; and 10) U.S. Pat. No. 6,589,100.

While admixing organic oxidizers with soluble metal salt oxidizers addressed the issue of polishing rates, the presence of soluble metal ions exacerbates another problem—metal ion contamination of the substrate, and particularly of the dielectric portions of the substrate, which cause shorts and other electrical phenomena that degrade the product performance. Raghunath et al showed in Mechanistic Aspects Of Chemical Mechanical Polishing Of Tungsten Using Ferric Ion Based Alumina Slurries, in the Proceedings of the First International Symposium on Chemical Mechanical Planarization, 1997, that alumina slurries containing ferric salts is conducive to the formation of an insoluble layer of ferrous tungstate on tungsten. These metal ions migrate and change the electrical properties of the devices, and reduce the reliability of the integrated circuits with time. We found in controlled experiments that even slurries having only a small amount of iron salts, e.g., a slurry having several percent hydrogen peroxide with ~0.05% ferric nitrate, resulted in dielectric surface iron residues on a wafer of about $10^{+12}$ atoms/cm$^2$, compared to the industry goal of metal contamination levels below $10^{+10}$ atoms/cm$^2$.

A novel class of CMP compositions described in co-owned published U.S. Applications 20040029495, 20040006924, and 20030162398 that have an abrasive, preferably silica, with a surface coating of a transition metal, preferably iron or copper, capable of initiating a Fenton's reaction with the oxidizer, preferably hydrogen peroxide or periodic acid. The slurry provides greatly increased polishing rates of tungsten with much lower total concentrations of iron and with much lower contamination of the wafer, compared with the peroxide/soluble ferric nitrate slurry described above. Having iron bound to the surface of the abrasive particles reduces transition metal, e.g., iron, contamination considerably compared to the contamination remaining after polishing with soluble metal catalyst. Polishing under substantially identical conditions as those described in the preceding paragraph with an iron-coated silica slurry left iron residues on a wafer at ~5 times $10^{+10}$ atoms/cm$^2$. While this was about 20 times less than the contamination caused by the soluble iron-catalyzed slurry, greater improvements could be made.

The utility of ascorbic acid has been recognized in removing metal ions and abrasives from cleaned and polished surfaces, such as by use of post-etch or post-polish rinses described in U.S. Pat. Nos. 6,635,562; 6,723,691, 6,546,939, 6,156,661, 6,464,568, 5,981,454, 6,326,305, and 6,492,308.

Patents that disclose use of ascorbic acid in any CMP environment include: U.S. Pat. No. 6,806,193 describes using a solution containing ascorbic acid to precondition a polishing pad, but does not describe using ascorbic acid in a CMP composition; U.S. Pat. No. 6,786,945 which includes ascorbic acid in an indistinguished list of hundreds of additives for a slurry of particles having at least one of a rare earth metal hydroxide such as cerium hydroxide and a tetravalent metal hydroxide such as zirconium hydroxide, where no oxidizer is mentioned: U.S. Pat. No. 6,758,872 which lists ascorbic acid as an additive useful in a polishing slurry which has a peroxide but which does not contain soluble metal salts; U.S. Pat. No. 6,702,954 which describes slurries that can have peroxides and metal salt oxidizers, where ascorbic acid is only mentioned in two slurries in the examples that contain hydrogen peroxide but no soluble metal salts; U.S. Pat. Nos. 6,660, 639 and 6,508,953 which describes slurries that have ascorbic acid and an oxidizer selected from peroxides, persulfates or peroxydiphosphates, and further references an application which teaches adding metal salts to such slurries, but requiring the amount of ascorbic acid be high enough to retard corrosion of copper lines, e.g., 0.1% to 1% by weight of ascorbic acid. U.S. Pat. Nos. 6,656,022 and 6,656,021 describe slurries made of particles of soluble metal salts, where ascorbic acid is listed as an otherwise undistinguished acid useful in manufacturing solid organic abrasive particles, but there is no teaching of using soluble ascorbic acid in combination with soluble metal salts; U.S. Pat. Nos. 6,645,051, 6,258,140, 6,117,220, and 6,423,125 describe a polishing composition for a substrate to be used for a memory hard disk containing an organic acid (one of which was ascorbic acid) or a metal salt such as ferric nitrate, but these compositions are used to polish memory hard disks where larger amounts of metal ion oxidizers are used and metal ion contamination is not a factor (further, these patents describe using ascorbic acid or metal salts, and not the two in combination); U.S. Pat. No. 6,348,440 describes compositions for polishing stainless steel, and teaches using iron salts to catalyze hydrogen peroxide; U.S. Pat. No. 6,620,215 which describes CMP slurries having ascorbic acid and hydrogen peroxide, but no soluble metal salts; U.S. Pat. Nos. 6,546,939, 6,156,661, and 5,981,454 describing using ascorbic acid in a post clean treatment, but also describes the composition as useful for polishing copper, though the CMP compositions have no soluble metal ions; and U.S. Pat. No. 5,700,383 which describes a CMP composition containing an oxidant (water or H2O2), a fluoride salt, an abrasive, and a chelating agent, such as citric acid or ascorbic acid, but with no metal oxidizer.

Published U.S. application 20050003744 describes a CMP slurry having active ceria particles and optionally containing hydrogen peroxide and/or ascorbic acid, but there is no teaching of soluble metal salts in the slurry; Published U.S. application 20050067378 describes compositions to pre-roughen copper for use before polishing, where the composition can comprise ascorbic acid, and one composition for pre-roughening contained a cupric ion source, an organic acid (which could be ascorbic acid), a halide ion, and water, but no combination of ascorbic acid and soluble metal ions are described in any polishing composition; Co-assigned and pending Published U.S. application 20040134873 teaches a polishing composition comprising a hydroxylamine compound, optionally a second oxidizer which can be a metal salt, and optionally an acid selected from a list which includes ascorbic acid, and Co-assigned and pending Published U.S. application 20040140288 teaches an etching composition comprising periodic acid or other organic oxidizers, and optionally an acid selected from a list which includes ascorbic acid, but this application does not describe the particular advantages found with using ascorbic acid in combination with soluble metal salts in a polishing composition.

This invention relates to slurries that use regular amounts of per-type oxidizers with small quantities of metal ion oxidizers/polishing accelerators. There are problems associated with such compositions: first, once admixed the metal and oxidizer will react and the shelf life of the mixed slurry will be reduced; and second, metal ion contamination of the substrate, and particularly of the dielectric portions of the substrate, cause shorts and other electrical phenomena that degrade the product performance. What is needed is a CMP composition that addresses these problems.

SUMMARY OF THE INVENTION

All U.S. Patents and published U.S. applications specifically mentioned in this document are incorporated herein to the extent allowable for all purposes by reference thereto. All percentages are weight percent, and "ppm" is parts per million by weight. Chemical structures shown and described herein comprise sufficient H, which are typically not shown or enumerated.

The present invention pertains to chemical mechanical polishing or electrochemical polishing wherein the polishing composition contains 1) water, 2) optionally an abrasive material, 3) an oxidizer, preferably a per-type oxidizer, 4) a small amount of soluble metal-ion oxidizer/polishing accelerator, a metal-ion polishing accelerator bound to particles such as to abrasive particles, or both; and 5) at least one of the group selected from a) a small amount of a chelator, b) a small amount of a dihydroxy enolic compound, and c) a small amount of an organic accelerator.

An important embodiment of the present invention pertains to chemical mechanical polishing or electrochemical polishing of integrated circuits wherein the polishing composition contains at point of use 1) water, 2) optionally an abrasive material. 3) an oxidizer, preferably a per-type oxidizer, 4) a small amount of soluble metal-ion oxidizer/polishing accelerator, a metal-ion polishing accelerator bound to particles such as to abrasive particles, or both, and 5) about $6*10^{-5}$ to about $4.5*10^{-3}$, preferably $1.1*10^{-4}$ to about $3.4*10^{-3}$ for example from $5.6*10^{-4}$ to about $2.8*10^{-3}$ or from $1.1*10^{-3}$ to about $2.3*10^{-3}$ moles per liter of a dihydroxy enolic compound. Use of an abrasive pad during polishing, including when the pad-bound abrasive grains themselves contain a bound metal ion polishing accelerator, is encompassed in this invention. A preferred dihydroxy enolic compound is ascorbic acid at a concentration (at point of use and if in the absence of other dihydroxy enolic compounds) of between 10 and about 800 ppm, preferably between about 20 and about 600 ppm, typically between 100 and 500 ppm, for example between 200 and 400 ppm. These concentrations correspond to the above stated ranges which are given in moles per liter.

Another important embodiment of the present invention pertains to chemical mechanical polishing or electrochemical polishing of integrated circuits wherein the polishing composition contains at point of use 1) water, 2) abrasive particles having a metal-ion polishing accelerator bound to said abrasive particles material, 3) an oxidizer, preferably a per-type oxidizer, 4) optionally a small amount (e.g., <30 ppm) of soluble metal-ion oxidizer, and 5) about 0.1% to about 0.3% of an organic acid chelator.

Another important embodiment of the present invention pertains to chemical mechanical polishing or electrochemical polishing of integrated circuits wherein the polishing composition contains at point of use 1) water, 2) optionally abrasive particles, abrasive particles having a metal-ion polishing accelerator bound to said abrasive particles, or both, 3) an oxidizer, preferably a per-type oxidizer, 4) a small amount (e.g., between 2 ppm and 80 ppm) of soluble metal-ion oxidizer, and 5) a small amount (e.g., about 0.005% to about 0.3% of an organic accelerator, where the organic accelerator specifically does not include ninhydrin or phenacetin.

The present invention also pertains to surface-modified colloidal abrasive polishing compositions and associated methods of using these compositions, particularly for chemical mechanical planarization, wherein the slurry comprises low levels of chelating free radical quenchers, non-chelating free radical quenchers, or both.

Important embodiments of the invention are CMP slurries that include small quantities of dihydroxy enolic compounds, and in particular α,β-dihydroxy enolic compounds, which are effective to 1) stabilize and provide excellent shelf life to CMP slurries comprising small amounts of soluble metal ion oxidizers/polishing accelerators in combination with an organic oxidizer, and 2) to reduce the amount of metal ion surface contamination from said CMP slurries. The addition of the dihydroxy enolic compound is beneficial to at least some embodiments of the CMP slurries described in the various patents mentioned herein. Adding too much of the dihydroxy enolic compounds at point of use can retard the efficiency of the combination of the metal ion polishing accelerator(s) in combination with the per-type oxidizers (as described in the prior art) and this is strongly discouraged.

It has been found that CMP polishing compositions comprising water and: A) an abrasive modified with a Fenton's reagent metal ion (particularly iron and/or copper ions) coated on the surface thereof, e.g., an iron-surface-modified silica abrasive such as was described in pending and allowed U.S. application Ser. No. 10/361,822 or an iron-boron-surface-modified silica abrasive described herein and in pending and allowed application Ser. No. 10/759,666; B) an oxidizer that produces free radicals when contacted by said coated abrasive, preferably a per-type oxidizing agent, most preferably hydrogen peroxide and/or periodic acid; and C) low levels of a chelator, preferably an organic acid chelator, e.g., lactic acid, can provide increased polishing rates and also reduce residual metal ion contamination of the substrate. By low levels of a chelator we mean less than 0.5% (by weight) at point of use. Additionally, it has been found that such CMP polishing compositions possess increased stability (and resultant shelf-life) with regard to maintaining levels of components over long periods and consequently maintaining propensity for affording high removal rates over long periods in comparison to otherwise identical compositions without a chelator being present. It has further been found that CMP polishing compositions comprising A) the above-mentioned abrasive modified with a Fenton's reagent metal coated on the surface thereof; B) the above-mentioned oxidizer that produces free radicals when contacted by said coated abrasive, and D) low levels of a non-chelating free radical quencher, preferably a dihydroxy enolic compound, e.g., ascorbic acid or derivative thereof, possess high stability (and resultant long shelf-life) with regard to maintaining near constant levels of components over long periods and consequently maintaining propensity for affording high removal rates over long periods in comparison to otherwise identical compositions without ascorbic acid (or a derivative thereof) being present. By low levels of non-chelating free radical quencher we mean less than 0.5%, preferably less than 0.2%, more preferably less than 0.1%, for example between about 20 ppm and about 600 ppm at point of use.

A specific preferred embodiment comprises between about 100 ppm and about 500 ppm ascorbic acid in a slurry comprising an abrasive modified with a Fenton's reagent metal coated on the surface thereof, e.g., a boron-iron-surface-modified silica, where the total amount of iron in the slurry at point of use is between about 1 ppm and about 40 ppm, preferably between about 2 ppm and about 30 ppm, for example between about 3 ppm and about 20 ppm iron, and at least a portion, preferably at least one third, more preferably at least two thirds of this iron is disposed on the abrasive, wherein the abrasive is present in an amount between about 0.1% and about 5%, for example 0.3% to about 2% by of abrasive, e.g., boron-surface-modified silica. Additionally, it has been found that such CMP polishing compositions are effective in reducing metal ion contamination, including iron ion contamination, on the polished surface of wafers, and the effect is more pronounced than with equivalent amounts of the above-mentioned C) organic acid chelator. This effect is surprising because 1) there is so little ascorbic acid present, and 2) ascorbic acid is generally considered, especially at concentrations below 0.1%, to be non-chelating. Surprisingly, ascorbic acid is as good as or superior to chelators in reducing iron ion contamination of wafers, and we believe (without being bound by theory) that the reason for this is ascorbic acid is much more effective than organic acid chelators such as lactic acid at removing metal ions that are bound to or absorbed on the substrate. This is highly advantageous in manufacturing semiconductor-type substrates as the active removes metal contamination during polishing, this eliminates additional cleaning or buffing steps during the fabrication of semiconductor devices.

Optional other ingredients, classified as non-chelating free radical quenchers, include thiamine, 2-propanol, and alkyl glycols, and also tocopherol (i.e., vitamin E) and derivatives thereof, and various catechins and derivatives thereof such as gallocatechins and epicallogatechins.

An embodiment of this invention comprises low levels of a chelator and also low levels of dihydroxy enolic compound(s), e.g., a slurry containing both lactic acid and ascorbic acid, respectively. Chelators include polyfunctional organic acids, for example having a carboxyl moiety and in an alpha or beta position a hydroxyl moiety. Suitable chelating agents for use in the compositions and methods of the invention include, but are not limited to, phthalic acid, citric acid, malonic acid, oxalic acid, adipic acid, lactic acid, .A-inverted.-hydroxy acids, and .A-inverted.-keto acids. Suitable .A-inverted.-keto acid for use in the compositions and methods of the invention include, but are not limited to, pyruvic acid and hydroxypyruvic acid. Representative .A-inverted.-hydroxy acids include, but are not limited to, 2-methyl 2-hydroxypropanoic acid; 2-hydroxybutanoic acid; phenyl 2-hydroxyacetic acid; phenyl 2-methyl 2-hydroxyacetic acid; 3-phenyl 2-hydroxyacetic acid; 2,3-dihydroxypropanoic acid; 2,3,4-trihydroxybutanoic acid; 2,3,4,5,6-pentahydroxyhexanoic acid; 2-hydroxydodecanoic acid; 2,3,4,5-tetrahydroxypentanoic acid; 2,3,4,5,6,7-hexahydroxyheptanoic acid; diphenyl 2-hydroxyacetic acid; 2-hydroxyhexanoic acid; 2-hydroxy-3-methylbutanoic acid; 2-hydroxy-4-methylpentanoic; 2-hydroxy-2-methylbutanoic acid. Preferred chelators include citric acid or lactic acid.

We have also uncovered a number of organic accelerators that when used with certain soluble metal oxidizers/polishing accelerators and with a per-type oxidizer is that the resulting slurry, which also contains a per-type oxidizer, exhibits an increased polishing rate as compared to the equivalent slurry but not containing the organic accelerator(s) of this invention. The CMP compositions for use in polishing integrated circuit substrates that comprise both a small amount of soluble metal ions and optionally but preferably organic per-type oxidizers can advantageously have an organic accelerator. As used herein, the term "organic accelerators" encompasses organic compounds that are not the dihydroxy enolic compounds of this invention, but which form a coordination complex with soluble metal-containing ions, especially with soluble Fenton metal ions and soluble rare earth metal ions, such that the complexed soluble metal ion have increased activity (relative to non-complexed ions such as are obtained by dissolving small amounts of e.g. ferric nitrate in water) such that the polishing rate goes up when the appropriate amount of the organic accelerators are added. This is distinguished from simple rate increases due to the presence of chelators, where solubility of ions polished from the substrate surface is a limiting factor on the polishing rate. An exemplary amount of organic accelerator from about 0.7 to about 3, for example between about 0.9 and 1.5, moles of organic accelerator per total moles of soluble (and complexable) transitional metal ion polishing accelerators and soluble (and complex-able) rare earth metal ions in the composition prior to polishing the substrate. Generally, adding stabilizing chelators to compositions containing low levels of soluble metal ion oxidizer/polishing accelerators and per-type oxidizers will reduce the polishing rate, and this had been considered to be a necessary tradeoff to provide minimum levels of stability to the composition. Therefore, another embodiment of this invention is CMP polishing compositions comprising A) water, B) soluble metal ions, especially soluble iron and/or copper ions, C) a per-type oxidizer, and D) at least one organic accelerator.

The various embodiments of this invention have a number of common elements, that is, 1) soluble and/or insoluble metal ion oxidizers/polishing accelerators, 2) a per-type oxidizer, 3) typically an abrasive, and 4) a small amount of organic substances selected from chelators, dihydroxy enolic compounds, other non-chelating free radical quenchers, a organic accelerators, or any mixture or combination thereof.

Surprisingly, an additional benefit is that certain combinations of the product of mixing the dihydroxy enolic compound(s) of this invention with certain soluble metal oxidizers or polishing accelerators is that the resulting slurry, which also contains an organic per-type oxidizer, exhibits an increased polishing rate as compared to the slurry not containing the dihydroxy enolic compound(s) of this invention. Even more surprisingly, an additional benefit is that the dihydroxy enolic compound(s) of this invention in a CMP formulation prevents deposition of metal ions on a dielectric substrate much more efficiently than an equal concentration of one or more chelators. Even more surprising, an additional benefit is that the dihydroxy enolic compound(s) of this invention in a CMP formulation efficiently removes metal ions tightly bound to a dielectric substrate surface.

Generally, α,β-dihydroxy enolic compounds have a structure 1:

Structure 1

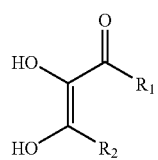

wherein R1 and R2 can each be any moiety containing between 1 and 20 atoms selected from C, O, S, P, and N in a straight chain, branched chain, or ring-containing structure (including one or more rings formed by joining R1 and R2) having any of single and/or double bonds between adjacent atoms. Structures shown and described herein comprise sufficient H, which are typically not shown or enumerated. The α,β-dihydroxy enolic of structure 1 must be soluble in water at the active concentration. A more preferred α,β-dihydroxy enolic embodiment is shown in structure 2:

Structure 2

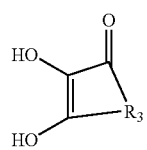

wherein R3 is a moiety comprising between two and four linked atoms independently selected from C, O, S, P, and N having any of single and/or double bonds between adjacent atom and which with the α,β-dihydroxy enolic portion form a 5-, 6-, or 7-member ring, wherein any C, P, or N atom of the R3 structure independently can be substituted with moieties containing between 1 and 20 atoms selected from C, O, S, P, and N in a straight chain, branched chain, or ring-containing structure having any of single and/or double bonds between adjacent atoms. The various atoms making up the ring structure, and the various substitutes moieties added to atoms of the ring structure, should not destroy the α,β-dihydroxy enolic ring structure and should not sterically hinder the α,β-dihydroxy enolic functionality from contacting ions in the CMP composition and advantageously also contacting the surface of the substrate being polished. Additionally, the various R3 structures should be selected so that the compound has sufficient solubility to remain in solution at its active concentration.

Preferred embodiments have a five ring member. Exemplary α,β-dihydroxy enolic five member ring compounds include: 4-Dihydroxymethyl-2,3-dihydroxy-cyclopent-2-enone; 4-(1,2-Dihydroxy-ethyl)-2,3-dihydroxy-cyclopent-2-enone; 3,4-Dihydroxy-5-hydroxymethyl-5H-furan-2-one; 3,4-Dihydroxy-5-(1-hydroxy-propyl)-5H-furan-2-one; 3,4-Dihydroxy-5H-thiophen-2-one; 3,4-Dihydroxy-5H-furan-2-one; 2,3-Dihydroxy-cyclopent-2-enone; and 3,4-Dihydroxy-1,5-dihydro-pyrrol-2-one. Similar α,β-dihydroxy enolic six member ring structures and α,β-dihydroxy enolic seven member ring structures will also be effective. Exemplary six member ring dihydroxy enolic compounds include 2,3-dihydroxy-1,4-benzenedione; 2,3-Dihydroxy-1H-pyridin-4-one; 2,3-Dihydroxy-thiopyran-4-one; Tetrahydroxy 1,4-benzoquinone, and in its most simple form 2,3-Dihydroxy-cyclohexa-2,5-dienone or 2,3-Dihydroxy-cyclohex-2-enone. Exemplary seven member ring dihydroxy enolic compounds include 2,3-Dihydroxy-cyclohepta-2,6-dienone and 5,6-Dihydroxy-1,7-dihydro-azepin-4-one.

The most preferred α,β-dihydroxy enolic compounds are ascorbic acid and the similar erythorbic acid, or derivatives and/or mixtures thereof. Ascorbic acid suffers from a lack of stability in aqueous formulations, and many derivatives exhibit increased longevity in an aqueous solution when compared to ascorbic acid. The phrase "derivatives thereof", when referring to ascorbic acid and erythorbic acid includes, but is not limited to, esters, ethers, (less preferably) amides, and salts of these molecules. Accordingly, "ascorbic acid derivatives" include, but are not limited to esters, ethers, and salts of ascorbic acid.

There are a wide variety of known ascorbic acid derivatives which can be useful here (provided there is sufficient solubility), most of which were synthetic lipophilic ascorbic acid derivative developed for use by the cosmetic industry. Methods of manufacturing exemplary esters are described for example in U.S. Pat. No. 4,151,178. With respect to the esters, they may be selected from the group consisting of fatty acid mono-, di-, tri-, or tetra-esters of ascorbic acid (or erythorbic acid). Nonlimiting examples are the preferred monoesters such as ascorbyl palmitate (i.e., L-ascorbyl 6-palmitate), ascorbyl laureate, ascorbyl myristate, ascorbyl stearate, and also di-esters such as ascorbyl dipalmitate and tri-esters such as ascorbyl tripalmitate. Salts useful in this invention include ascorbic acid 2-phosphate salts including ascorbic acid-2-phosphoric esters, ascorbic acid 2-sulfate salts, and ascorbic acid 2-phosphate salts. Some semiconductor fabrication materials can have problems with phosphate ions, but sulfate ions are generally tolerated. The variety of useful derivatives is substantial, and in addition to the readily available derivatives discussed above are other derivatives such as ascorbyl polypeptide, 5,6-O-isopropylpylidene-L-ascorbic acid and silylated ascorbic acid derivatives as described in US published application 20050112158.

Particularly suitable derivatives are esters formed between a carboxylic acid and the primary hydroxyl group of the glycol moiety of ascorbic acid. Any C1-C24 carboxylic acid can be used to form the ester. In one embodiment, the carboxylic acid is fatty acid. The term fatty acid, as used herein, means a saturated or unsaturated, straight chain or branched C8-C24 carboxylic acid. In one embodiment, the fatty acid is a C8-C18 carboxylic acid. In one embodiment, the fatty acid is a C10-C18 carboxylic acid. Representative C8-C22 carboxylic acid include, but are not limited to, caproic acid, lauric acid, myristic acid, palmitic acid, stearic acid, palmic acid, oleic acid, linoleic acid, and linolenic acid. Palmitic acid esters are particularly useful. The ascorbic acid can optionally be substituted with any C1-C24 sulfonic acid, C1-C24 phosphonic acid, or the like to form the ester. Other representative derivatives of ascorbic acid include, but are not limited to, ascorbic palmitate; dipalmitate L-ascorbate; ammonium L-ascorbate-2-sulfate; or an ascorbic salt such as an ammonium salt. In one especially preferred embodiment, the ascorbic acid derivative is ascorbic palmitate, ascorbic acid, or mixture thereof.

Other ascorbic acid derivatives are those similar to the exemplary structure is shown in Structure 3.

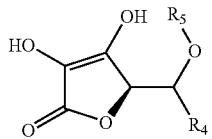

Structure 3 where R4 is hydrogen, hydroxyl, or a straight or branched C1-C24 alkyl or alkaryl, which may be optionally substituted with hydroxy, carboxy, phosphono, and/or sulfono groups, or a straight or branched C1-C24 alkyl ester or alkaryl ester, which may be optionally substituted with hydroxy, carboxy, phosphono, and/or sulfono groups, R5 is hydrogen, or a straight or branched C1-C24 alkyl or alkaryl, which may be optionally substituted with hydroxy, carboxy, phosphono, and/or sulfono groups.

While having the dihydroxy enolic functional group on a ring structure is preferred, the compound need not be a single ring structure. For example, 2,3-dihydroxy-1,4-naphthalenedione and 2,3-dihydroxy-1-naphthalene-one are exemplary α,β-dihydroxy enolic compounds having a two ring naphthalene basic structure. Dihydroxy enolic compounds which are 1,4-naphthoquinone derivatives, 1,4 benzoquinone derivatives, and 1,4-anthraquinone derivatives and/or thiols are useful in the compositions of this invention.

Other embodiments include dihydroxy enolic compounds having an hydroxy on each adjacent a carbon as seen in structure 4 (where R3 is as was previously described)

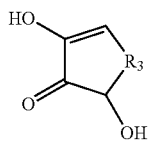

Structure 4

Compounds of this type are not expected to be as effective as are the preferred α,β-dihydroxy enolic functional group disposed within a ring structure.

The CMP slurry of this invention is used for CMP and/or ECP processing of integrated circuit substrates comprising a surface to be polished, and the CMP slurry advantageously comprise or consists essentially of: a) an effective amount of at least one dihydroxy enolic compound as described herein, and as shown herein in any of the structures depicted; b) water; c) one or more soluble transitional metal ions, one or more soluble rare earth metal ions, or both, wherein the soluble metal ions are not the product of the instant polishing of the metal on the substrate surface but are present to function as an oxidizer or polishing accelerator, and wherein the total amount of soluble transitional metal ions and/or soluble rare earth metal ions is between about 0.0005% to about 0.4%, preferably between about 0.001% to about 0.1%, for example between about 0.005% to about 0.05%, wherein the percent is weight percent of the metal based on the weight of the CMP composition; and d) optionally, one or more organic oxidizers, for example hydroxylamine or a per-type oxidizer, most preferably a hydrogen peroxide, ammonium persulfate, or periodic acid.

The soluble metal can be complexed with one or more "stabilizers" as the term is described in U.S. Pat. No. 5,980,775, for example with: phosphoric acid, simple di- or tri-functional carboxylic acids such as oxalic, citric, lactic, maleic, oxalic, adipic, citric, malonic, orthophthalic, gallic, tartaric, or succinic acids, EDTA or DPTA, di- or tri-functional phosphonate compounds or di- or tri-functional phosphonate-carboxylate compounds (such as are known in the industry as Dequest® product, e.g., ATMP or DPTHA, benzonitrile, and other ligands which bind to the metal and reduce its reactivity toward hydrogen peroxide decomposition and mixture thereof. It makes lot of sense to use for example lactic acid for the stabilization of a composition containing both soluble iron (or copper) and hydrogen peroxide. We tested several compounds from the standpoint of stabilization of H2O2, and found them to be more or less effective. However, such stabilizers can be used alone or in combination and significantly decrease the rate at which organic oxidizing agents such as hydrogen peroxide decompose. Further, such stabilizers do not effectively keep a dielectric surfaces on the integrated circuit surface from being contaminated with metals. Most preferably the CMP composition is free of such "stabilizers" as the term is described in U.S. Pat. No. 5,980,775.

Other suitable chelators, if used, include polyfunctional organic acids, for example having a carboxyl moiety and in an alpha or beta position a hydroxyl moiety. Suitable ∀-keto acid for use in the compositions and methods of the invention include, but are not limited to, pyruvic acid and hydroxypyruvic acid. Representative ∀-hydroxy acids include, but are not limited to, 2-methyl 2-hydroxypropanoic acid; 2-hydroxybutanoic acid; phenyl 2-hydroxyacetic acid; phenyl 2-methyl 2-hydroxyacetic acid; 3-phenyl 2-hydroxyacetic acid; 2,3-dihydroxypropanoic acid; 2,3,4-trihydroxybutanoic acid; 2,3,4,5,6-pentahydroxyhexanoic acid; 2-hydroxydodecanoic acid; 2,3,4,5-tetrahydroxypentanoic acid; 2,3,4,5,6,7-hexahydroxyheptanoic acid; diphenyl 2-hydroxyacetic acid; 2-hydroxyhexanoic acid; 2-hydroxy-3-methylbutanoic acid; 2-hydroxy-4-methylpentanoic; 2-hydroxy-2-methylbutanoic acid. Advantageously the CMP composition is substantially free of the above compounds, e.g., the molar concentration of the above compounds are less than, preferably less than half, of the molar concentration of compounds having the dihydroxy enolic functional group, or are present at concentrations less than 0.2%, whichever is least.

In one embodiment the moles of dihydroxy enolic compounds, and optionally the even more preferred compounds having the α,β-dihydroxy enolic functional group disposed within a ring structure, present in the slurry should be greater than one half of the number of moles of soluble transitional metal ions and/or soluble rare earth metal ions in the slurry. As used herein, the term "equivalents of dihydroxy enolic compounds in the CMP composition (pre-polish)" means moles of dihydroxy enolic compounds per total moles of soluble transitional metal ions and/or soluble rare earth metal ions in the CMP composition just prior to polishing, that is, excluding metal ions which may be instantly polished from the substrate. Advantageously, the equivalents of dihydroxy enolic compounds in the CMP composition (pre-polish) should be at least 1, preferably at least 1.5, so that there is sufficient dihydroxy enolic compounds available to form a coordination complex with each soluble transitional metal ion and/or soluble rare earth metal ion in the pre-polish slurry. Again, the amount of soluble transitional metal ions and/or soluble rare earth metal ions in the pre-polish slurry is advantageously below about 0.4%, preferably below 0.1%, and more preferably below 0.05%, based on the weight of metal ions, e.g., ions of Fe, Cu, Ce, Ag, and the like. Preferably, the equivalents of dihydroxy enolic compounds in the CMP composition (pre-polish) should be at least between about 2 and about 20 times, for example between about 3 and about 6 times, the total moles of soluble transitional metal ions and/or soluble rare earth metal ions in the CMP composition just prior to polishing.

Alternatively, the amount of dihydroxy enolic compounds, and optionally the even more preferred compounds having the α,β-dihydroxy enolic functional group disposed within a ring structure, is more advantageously a function not only of the total moles of soluble transitional metal ions and/or soluble rare earth metal ions in the CMP composition just prior to polishing, but also is a function of the total moles of soluble transitional metal ions and/or soluble rare earth metal ions in the CMP composition during polishing, which takes into account the metals in the slurry before polishing as well as the metals in the slurry after polishing. As used herein, the term "equivalents of dihydroxy enolic compounds in the CMP composition (post-polish)" means moles of dihydroxy enolic compounds per moles of soluble transitional metal ions and/or soluble rare earth metal ions in the CMP composition just prior to polishing plus the total moles of metal ions which were polished from the substrate. Advantageously, the equivalents of dihydroxy enolic compounds in the CMP composition (post-polish) should be at least 1, preferably at least 1.5, so that there is sufficient dihydroxy enolic compounds available to form a coordination complex with each soluble transitional metal ion and/or soluble rare earth metal ion in the post-polish slurry. Again, the amount of soluble transitional metal ions and/or soluble rare earth metal ions in the pre-polish slurry is advantageously below about 0.4%, preferably below 0.1%, and more preferably below 0.05%, based on the weight of metal ions, e.g., ions of Fe, Cu, Ce, Ag, and the like. The amounts of metal ions that can be introduced by the polishing procedure is variable but is readily calculated by an operator who specifies the target metal removal rate and the rate of slurry flow over the substrate slurry during polishing. Generally, under typical slurry flow rates and typical metal removal rate goals, the polishing process can be expected to add between 10 ppm and 200 ppm (0.001% to 0.02%) of metal ions to the slurry. While this is a somewhat trivial amount (in terms of added metal ion contamination of a substrate) of added metal if the pre-polish slurry has 0.4% of soluble metal ions used as an oxidizer/polishing accelerator, it can be an appreciable share of the total metal ion problem if the if the pre-polish slurry is a preferred variant having less than 0.05% of soluble metal ions. Preferably, the equivalents of dihydroxy enolic compounds in the CMP composition (pre-polish) should be at least between about 2 and about 20 times, for example between about 3 and about 6 times, the total moles of soluble transitional metal ions and/or soluble rare earth metal ions in the CMP composition just after polishing.

In an iron-coated abrasive system as discussed previously, the total amount of iron in a point-of-use iron-coated-abrasive-containing slurry is preferably between about 1 ppm to about 80 ppm (0.0001% to 0.008% by weight of metal ions), and is typically between about 5 ppm and about 40 ppm (0.0005% to 0.004% by weight of metal ions). Generally, only a few percent of this iron is in the supernate, while most iron remains tightly bound to the abrasive. In contrast, U.S. Pat. No. 5,958,288 states that a preferred embodiment for use with H2O2 "includes from about 0.01 to about 0.05 weight percent ferric nitrate," which corresponds to between 0.0047% to 0.024% as soluble iron ions, or between about 47 to 240 ppm soluble iron. In side-by-side comparisons, we found that in CMP compositions having identical compositions, that iron coated on silica was much more effective at increasing the removal rate of for example tungsten than was a similar amount of soluble metal ions. This is consistent with U.S. Pat. No. 5,980,775, a CIP of U.S. Pat. No. 5,958,288, relating to the addition of stabilizing chelators to a soluble iron/H2O2 composition, which stated:

"It is well known that hydrogen peroxide is not stable in the presence of many metal ions without the use of stabilizers. For this reason, the CMP composition and slurries of this invention may include a stabilizer. Without the stabilizer, the catalyst and the oxidizing agent may react in a manner that degrades the oxidizing agent rapidly over time. The addition of a stabilizer to compositions of this invention reduces the effectiveness of the catalyst."

In contrast, we have surprisingly found that soluble iron ions, when part of a coordination complex with the dihydroxy enolic compounds of this invention, exhibit increased activity (as reflected in the metal removal rate, e.g., the tungsten removal rate) relative to a similar amount of soluble metal ions. Indeed, we surprisingly found that the activity of low levels of soluble metal ions, for example the activity of slurries containing less than 50 ppm of iron, that the metal removal rates of slurries having soluble coordination complexes of iron and a dihydroxy enolic compound. e.g., ascorbic acid or ascorbic palmitate, exhibited metal removal rates that approached the removal rates of a slurry having substantially the same composition but with the iron coated on a silica abrasive. Without being bound by theory, it is possible that the dihydroxy enolic compound when formed into a coordination complex with a soluble metal ion may accelerate the production of free radicals by lowering the redox potential of the metal, allowing the metal to react more easily.

Advantageously, the CMP compositions for use in polishing integrated circuit substrates that comprise both a small amount of soluble metal ions and optionally but preferably organic per-type oxidizers can advantageously have an organic accelerator. As used herein, the term "organic accelerators" encompasses organic compounds that are not the dihydroxy enolic compounds of this invention, but which form a coordination complex with soluble metal-containing ions, especially with soluble Fenton metal ions and soluble rare earth metal ions, and the complexed soluble metal ion exhibits increased activity such that the polishing rate goes up. This is distinguished from simple rate increases due to the presence of chelators, where solubility of ions polished from the substrate surface is a limiting factor on the polishing rate. Generally, the CMP composition can comprise between about 0.1 to about 100, but preferably from about 0.7 to about 3, for example between about 0.9 and 1.5, moles of organic accelerator per total moles of soluble (complex-able) transitional metal ions and soluble (complex-able) rare earth metal ions in the composition prior to polishing the substrate. We believe that diketones are well known metal chelators, and are useful for increasing tantalum removal rates. We have found that certain alkyne polyols complex with iron and the "Fe-alkyne coordination complex" increased tungsten removal rates by activating hydrogen peroxide. A particularly preferred alkyne polyol organic accelerator is Surfynol® 104E (Air Products and Chemicals, Allentown, Pa.) which contains 2,4,7,9-tetramethyl-5-decyn-4,7-diol. Other exemplary alkyne polyols include 4,7-Dimethyl-dec-5-yne-4,7-diol; 3,6-Dimethyl-oct-4-yne-3,6-diol; 2,5-Dimethyl-hex-3-yne-2,5-diol; and 4-Methyl-pent-2-yne-1,1,4-triol.

Further, the addition of high frequency sonic energy and/or photon of specific energies may further accelerate free radical production. We subsequently uncovered a number of other organic accelerators. U.S. Published Application 2003/0082101 describes a number of compounds that are useful in biological systems where the goal is to increase free radical production, and several of these are useful in the more aggressive environment of a CMP composition. Published Application 2003/0082101 states the systems described therein are useful for accelerating Fenton's type reactions, which we believe are the primary pathway by which iron bound to silica abrasives increases metal polishing rates. This Published Application 2003/0082101 also describes systems:

"able to take advantage of the Fenton and Fenton-type reactions, which involves the reaction of hydrogen peroxide with a transition metal to produce hydroxyl radical and hydroxyl radical ion. According to the present invention, ultrasound can be used to accelerate the Fenton reaction in vivo;"

"able to take further advantage of Fenton and Fenton-type reactions by adding an additional transition metal, adding a chelant, and/or adding a reductant. The chelant preferably reduces the reduction potential of the transition metal, and the reductant preferably has a reduction potential which permits reduction of the transition metal or transition metal complex to a lower oxidation number;"

which "takes advantage of the correlation between known Fenton activity of a substance and the ability to accelerate free radical production during exposure to ultrasound. . . . Upon application of ultrasound, iron from biological sources is mobilized and will interact with hydrogen peroxide generated from the action of ultrasound on water and oxygen, resulting in the production of hydroxyl ion and hydroxyl ion radical. The reductant accelerates the reaction of the metal by reducing it back to an active species after it has reacted with the hydrogen peroxide."

We believe that each of the above statements and processes are equally applicable to CMP systems involving small quantities of soluble transition metals and/or rare earth metals capable of catalyzing a Fenton's type reagent in the presence of H2O2.

Examples of compounds described in Published Application 2003/0082101 as being able to accelerate the production of free radicals, which would be useful in a CMP composition as an organic accelerator, include 2-methyl 2-hydroxypropanoic acid; 2-hydroxybutanoic acid; phenyl 2-hydroxyacetic acid; phenyl 2-methyl 2-hydroxyacetic acid; 3-phenyl 2-hydroxypropanoic acid; 2,3-dihydroxypropanoic acid; 2,3,4-trihydroxybutanoic acid; 2,3,4,5-tetrahydroxypentanoic acid; 2,3,4,5,6-pentahydroxyhexanoic acid; 2-hydroxydodecanoic acid; 2,3,4,5,6,7-hexahydroxyheptanoic acid; diphenyl 2-hydroxyacetic acid; 4-hydroxymandelic acid; 4-chloromandelic acid; 3-hydroxybutanoic acid; 4-hydroxybutanoic acid; 2-hydroxyhexanoic acid; 5-hydroxydodecanoic acid; 12-hydroxydodecanoic acid; 10-hydroxydecanoic acid; 16-hydroxyhexadecanoic acid; 2-hydroxy-3-methylbutanoic acid; 2-hydroxy-4-methylpentanoic acid; 3-hydroxy-4-methoxymandelic acid; 4-hydroxy-3-methoxymandelic acid; 2-hydroxy-2-methylbutanoic acid; 3-(2-hydroxyphenyl) lactic acid; 3-(4-hydroxyphenyl) lactic acid; hexahydromandelic acid; 3-hydroxy-3-methylpentanoic acid; 4-hydroxydecanoic acid; 5-hydroxydecanoic acid; aleuritic acid; 2-hydroxypropanedioic acid; 2-hydroxybutanedioic acid; erythranic acid; threaric acid; arabiraric acid; ribaric acid; xylaric acid; lyxaric acid; glucaric acid; galactaric acid; mannaric acid; gularic acid; allaric acid; altraric acid; idaric acid; talaric acid; 2-hydroxy-2-methylbutaned-ioic acid; agaricic acid; quinic acid; glucuronic acid; glucuronolactone; galacturonic acid; galacturonolactone; uronic acids; uronolactones; dihydroascorbic acid; tropic acid; ribonolactone; gluconolactone; galactonolactone; gulonolactone; mannonolactone; ribonic acid; gluconic acid; citramalic acid; hydroxypyruvic acid; hydroxypyruvic acid phosphate; 4-hydroxybenzoyl formic acid; 4-hydroxyphenyl pyruvic acid; and 2-hydroxyphenyl pyruvic acid. Additionally, certain other compounds increase free radical production when exposed to ultrasound and a metal, such as hydroxy-1,4-naphthoquinones: 5-hydroxy-1,4-naphthoquinone, 2-hydroxy-3-(3-methyl-2-butenyl)-1,4-naphthoquinone, 5-hydroxy-2-methyl-1,4-naphthoquinone, and 5,8 dihydroxy-1,4-naphthoquinone. Other compounds effective to increase free radical production include tetracycline antibiotics and their derivatives which can act as chelants and/or reducing agents, and certain derivatives can form a dihydroxy enolic structure. Examples include but are not limited to methacycline, doxycycline, oxytetracycline, demeclocyline, and meclocycline, oxytetracycline, demeclocycline and minocycline. Other compounds effective to increase free radical production include hydroxylated 1,4-naphthoquinones such as: 1,4-naphthalenedione, 2,5,8-trihydroxy; 1,4-naphthalenedione, 2-hydroxy; 1,4-naphthalenedione, 2-hydroxy-3-(3-methylbutyl); 1,4-naphthalenedione, 2-hydroxy-3-methyl; 1,4-naphthalenedione, 5,8-dihydroxy-2-methyl; and alkannin. Other compounds effective to increase free radical production include hydroxylated anthraquinones such as: alizarin and 1,4-dihydroxy-2-methylanthraquinone. In one embodiment, a CMP composition having soluble transitional and/or rare earth ions and an organic per-type oxidizer further comprises hydroxylated 1,4-naphthoquinones which are activated by ultrasound and remain inactive without ultrasound. Quinolines can also be used to enhance the Fenton reaction. The concentration of the above in a CMP concentration is advantageously in the same range of the concentration of the dihydroxy enolic compounds—e.g., typically between about 1 and 3 moles of organic accelerator per mole of soluble metal ions in the CMP composition prior to polishing.

Many compounds able to accelerate the production of hydroxyl free radicals in the CMP composition (aided by addition of ultrasonic energy and/or light energy) are described in U.S. Published Application 2003/0082101, the disclosure of which is incorporated by reference thereto. Generally, while it is anticipated that inclusion of one or more of the above in a CMP composition will increase polishing rates (especially if provided with activating ultrasonic energy or activating photons) the above are not dihydroxy enolic compounds, so not all the benefits of the dihydroxy enolic compounds are anticipated to be realized.

We believe that the key functional group, the dihydroxy enolic functional group, and specifically the even more preferred compounds having the $\alpha,\beta$-dihydroxy enolic functional group disposed within a ring structure, has an additional function. While simple chelators can isolate iron from peroxide and stabilize a soluble iron/H2O2 composition, these chelators function poorly at keeping the iron (and in some instances also metal ions polished from the substrate) from contaminating the dielectric surface of the substrate being polished. In contrast, the dihydroxy enolic compounds, e.g., the more preferred compounds having the $\alpha,\beta$-dihydroxy enolic functional group disposed within a ring structure, are able to prevent both soluble metal oxidizers AND soluble metal ions polished from a substrate from contaminating the dielectric surface of a substrate being polished.

The classes of integrated circuit CMP compositions which benefit from addition of compounds having the $\alpha,\beta$-dihydroxy enolic functional group disposed within a ring structure include: 1) those that contain an inorganic oxidizer and a small amount, e.g., below about 0.4%, preferably below 0.1%, and more preferably below 0.05%, of soluble metal ions, e.g., ions of Fe, Cu, Ce, Ag, and the like, added as an oxidizer or as a polishing accelerator; and 2) that contain a small amount, e.g., below about 0.4%, preferably below 0.1%, and more preferably below 0.05%, of soluble metal ions, e.g., ions of Fe, Cu, Ce, Ag, and the like, added as an oxidizer or as a polishing accelerator.

The oxidizers in a CMP composition can optionally contain one or more organic oxidizers, and there are preferably per-type oxidizers. A per-type oxidizer is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates, dipersulfates, and hydrohydrogen peroxide. Examples of compounds containing an element in its highest oxidation state include but are not limited to periodic acid, perbromic acid, perchloric acid, perboric acid, permanganates, and salts thereof. The preferred organic oxidizers are peroxides, periodic acid, and monopersulfates. The organic oxidizer may be present in the overall chemical mechanical polishing slurry in an amount ranging from about 0.05% to about 12.0%, preferably from about 0.5% to about 5%. Again, unless otherwise specified, all percentages are weight percent based on the total weight of the CMP composition.

While the use of soluble metal co-catalysts increases the speed at which H2O2 reacts with tungsten, they also require CMP slurries with dissolved ionic metallic components. As a result, the polished substrates can become contaminated by the adsorption of charged species from the metal co-catalysts. It is known to add chelating stabilizers to such slurries described above to reduce the decomposition of oxidizer, e.g., hydrogen peroxide, over time. U.S. Pat. No. 5,916,855, assigned to Advanced Micro Devices, Inc., describes a polishing slurry composition for planarization of silicon semiconductor wafers by CMP, wherein the slurry contains a ferric salt, an ammonium persulfate oxidizer, a fatty acid suspension agent, alumina particles with a small diameter and tight diameter range, coated with a solubility coating such as a phthalate-containing compound. U.S. Pat. No. 5,980,775, assigned to Cabot Corp., describes their slurry having a peroxide and a soluble metal catalyst as described in U.S. Pat. No. 5,958,288 (discussed above), and further including a "stabilizer." The "stabilizer" in this patent is not well defined, but there are a lot of examples, including: "an organic acid, an inorganic acid, a nitrile, or mixtures thereof"; a compound "selected from the group phosphoric acid, phthalic acid, citric acid, malonic acid, phosphonic acid, oxalic acid, adipic acid, benzonitrile, or mixtures thereof"; or a mixture of oxalic acid and adipic acid. U.S. Pat. No. 6,448,182 describes polishing the layer of material, e.g., tungsten, copper, aluminum, a dielectric material, or any combination thereof, by subjecting it to a polishing pad and a slurry which includes peroxygen; and wherein the slurry additionally includes a stabilizing agent which retards the decomposition of the peroxygen. The patent states that the decomposition of the peroxygen in the slurry is catalyzed by transition metals included in the slurry, and may be caused by the pH of the slurry. The stabilizing agent can be polyphosphoric acids, ethylenediamine tetraacetic acid, Diethylene triamine pentaacetic acid, pyrophosphoric acids, polyphosphonic acids, or salts thereof, and/or 8-hydroxyquinoline. Most stabilizing agents, as the term is used in the art, refer only to isolating metal ions from peroxide, and most stabilizing agents in the prior art have undesirable side effects such as lower metal removal rates. Generally, most peroxide stabilizers (as opposed to "organic accelerators described herein) are not preferred, and the CMP formulations are advantageously free of them.

It has been found that CMP polishing compositions comprising: A) an abrasive modified with a Fenton's reagent metal coated on the surface thereof, e.g. an iron-surface-modified silica abrasive such as was described by Small and Scott or an iron-boron-surface-modified silica abrasive described herein; B) an oxidizer that produces free radicals when contacted by said coated abrasive, e.g., a peroxide-type oxidizing agent, preferably hydrogen peroxide; and C) low levels of a chelator, e.g., lactic acid, can provide increased polishing rates. By low levels we mean less than 0.5% (by weight) at point of use. Additionally, it has been found that such CMP polishing compositions possess fair stability (and resultant shelf-life) with regard to maintaining levels of components over long periods and consequently maintaining propensity for affording high removal rates over long periods in comparison to otherwise identical compositions without a chelator being present.

It has further been found that CMP polishing compositions comprising: A) an abrasive modified with a Fenton's reagent metal coated on the surface thereof, e.g., an iron-surface-modified silica abrasive such as was described by Small and Scott or an iron-boron-surface-modified silica abrasive described herein; B) an oxidizer that produces free radicals when contacted by said coated abrasive, e.g., a peroxide-type oxidizing agent, preferably hydrogen peroxide; and D) low levels of a non-chelating free radical quencher, preferably an enolic compound, e.g., ascorbic acid or derivative thereof, possess high stability (and resultant long shelf-life) with regard to maintaining near constant levels of components over long periods and consequently maintaining propensity for affording high removal rates over long periods in comparison to otherwise identical compositions without ascorbic acid (or a derivative thereof) being present. By low levels we mean less than 0.5%, preferably less than 0.2%, for example less than 0.1%, or alternately between about 20 ppm and about 600 ppm at point of use. A specific preferred embodiment comprises between about 100 ppm and about 500 ppm ascorbic acid in a slurry comprising an abrasive modified with a Fenton's reagent metal coated on the surface thereof, e.g., a boron-iron-surface-modified silica, where the total amount of iron in the slurry at point of use is between about 1 ppm and about 40 ppm, preferably between about 2 ppm and about 30 ppm, for example between about 3 ppm and about 20 ppm iron, disposed on the between about 0.1% and about 5%, for example 0.3% to about 2% by of abrasive, e.g., boron-surface-modified silica. Additionally, it has been found that such CMP polishing compositions are effective in reducing iron ion contamination on the polished surface of wafers. This effect is surprising because 1) there is so little ascorbic acid present, and 2) ascorbic acid is generally considered, especially at concentrations below 0.1%, to be non-chelating. Surprisingly, ascorbic acid is as good as or superior to chelators in reducing iron ion contamination of wafers. As ascorbic acid (or a derivative thereof) removes metal contamination during polishing, this eliminates additional cleaning or buffing steps during the fabrication of semiconductor devices.

An embodiment of this invention comprises very low levels of a chelator and also very low levels of a dihydroxy enolic compound.

DETAILED DESCRIPTION OF EMBODIMENTS

Figure 1:
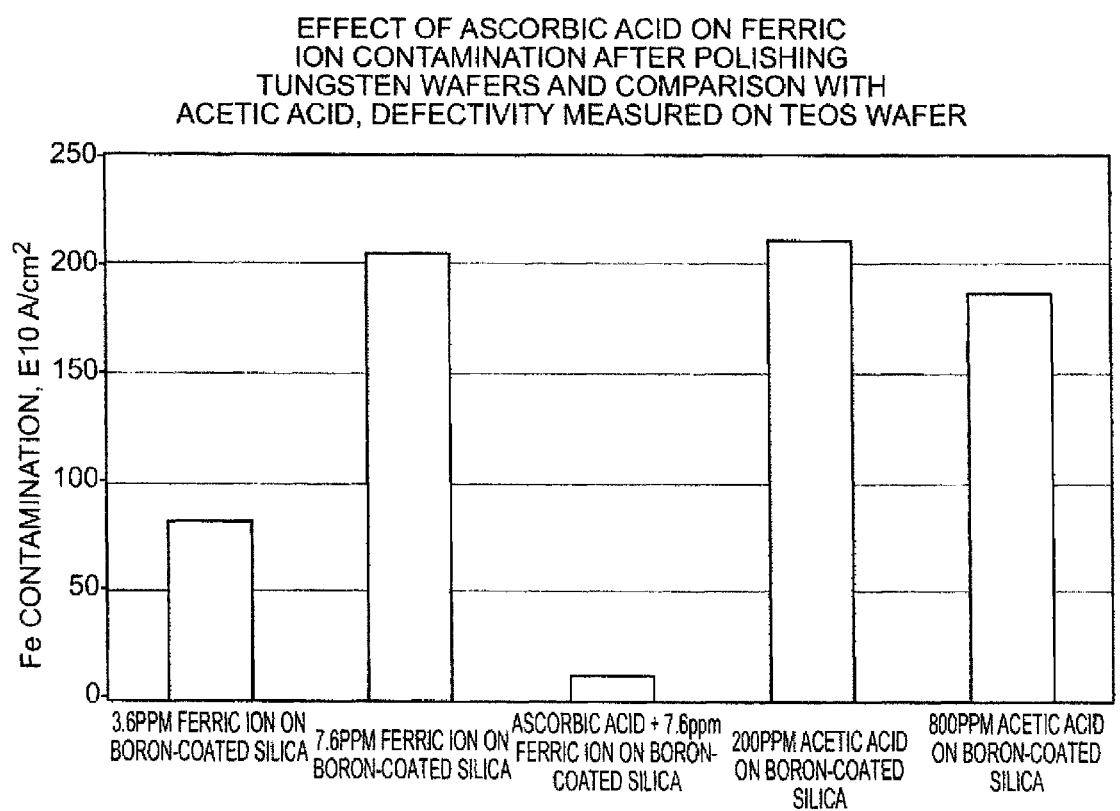
FIG. 1 is a graph showing the Effect of Ascorbic Acid on Ferric Ion Contamination After Polishing Tungsten Wafers.

The invention includes a method of polishing comprising the step of movably contacting the surface of an integrated circuit substrate having a metal or metallic compound thereon with a polishing composition comprising: 1) water; 2) optionally an abrasive material; 3) a per-type oxidizer; 4) at least one of: a) between about 2 ppm and about 0.4% of soluble transitional metal ion-containing polishing accelerators selected from iron ions, copper ions, or mixture thereof, or b) iron polishing accelerators, copper polishing accelerators, or mixture thereof coated on the abrasive; wherein the polishing accelerators were added to be a polishing accelerator and are not metal ions polished from the surface of the substrate; and 5) an $\alpha,\beta$-dihydroxy enolic compound in an amount between about $6*10^{-5}$ to about $4.5*10^{-3}$ moles per liter. Advantageously if the polishing composition comprises for example between about 1 ppm and about 40 ppm of iron ion, copper ions, or mixture thereof coated on said abrasive, it further comprises an organic acid chelator in an amount between about 0.05% and about 0.4%, for example citric acid, lactic acid, or both preferably in an amount between about 0.1% to about 0.3%. Advantageously the composition comprises between about $1.1*10^{-4}$ to about $3.4*10^{-3}$ moles per liter of the dihydroxy enolic compound, for example between about $5.6*10^{-4}$ to about $2.8*10^{-3}$ moles per liter of the dihydroxy enolic compound, and in a preferred commercial embodiment the dihydroxy enolic compound is ascorbic acid present in an amount between about 20 and about 600 ppm, for example between about 100 and about 500 ppm.

The abrasive can be a boric acid surface modified abrasive further modified with between about 1 ppm and about 40 ppm of iron ion, copper ions, or mixture thereof coated on said abrasive. In one embodiment the polishing composition comprises 2 ppm and about 0.4% of soluble transitional metal ion oxidizers, and further comprises an organic accelerator in an amount between about 0.005% to about 0.3%, wherein the organic accelerator forms coordination complexes with the soluble metal and increases metal or metallic compound removal rate from the substrate by a factor of at least 10% compared to the metal removal rate of an otherwise identical composition but not having the organic accelerator, where the organic accelerator does not include ninhydrin or phenacetin. A particularly preferred polishing composition comprises 0.3% to 5% of boric acid-surface-modified colloidal silica; 0.0005% to 0.02% of iron in soluble form, coated on the surface-modified colloidal silica, or portioned between the soluble form and coated on the surface-modified colloidal silica, from about 0.01% to about 0.08% of ascorbic acid or derivative thereof, about 1% to about 8% of hydrogen peroxide, and a balance water. In one embodiment the polishing composition is substantially free of ascorbic acid, as ascorbic acid has a somewhat limited shelf life. The dihydroxy enolic compound may comprise mono-, di-, tri-, or tetra-esters of ascorbic acid or erythorbic acid. Advantageously if the polishing composition comprises b) iron polishing accelerator coated on the abrasive; and after polishing the substrate is rinsed sufficiently to remove the polishing composition from the polished surface, then the polished surface contains after polishing and rinsing less than 1 E+11 iron atoms per square centimeter. It is important to minimize iron contamination. If the polishing composition comprises soluble iron or copper ions, it only has between about 0.001% to about 0.05% by weight of the soluble iron, copper, or mixture thereof.

Another aspect of the invention is a method of polishing an integrated circuit substrate comprising the steps of: A) movably contacting the surface of an integrated circuit substrate comprising a dielectric surface with an aqueous CMP composition comprising: a) ceria abrasive; and b) an $\alpha,\beta$-dihydroxy enolic compound in an amount between about $6*10^{-5}$ to about $4.5*10^{-3}$ moles per liter. In some embodiments the composition further comprises soluble rare earth ions.

Another aspect of the invention is a polishing composition comprising: A) an abrasive modified with a Fenton's reagent metal coated on the surface thereof; B) an oxidizer that produces free radicals when contacted by said coated abrasive; and C) an $\alpha,\beta$-dihydroxy enolic compound. Advantageously the abrasive is an iron-boron-surface-modified silica. Advantageously the $\alpha,\beta$-dihydroxy enolic compound comprises about 20 ppm and about 800 ppm ascorbic acid or a derivative thereof. Advantageously the polishing composition further comprises between about 0.05% and about 0.4% of a chelator. In one embodiment the composition further comprising between about 20 ppm and about 0.2% of a non-chelating free radical quencher. In one embodiment wherein the composition does not include ascorbic acid.

It has been found that aqueous CMP polishing compositions comprising or consisting essentially of:

A) an abrasive modified with a Fenton's reagent metal coated on the surface thereof, e.g., an iron-boron-surface-modified silica abrasive such as described herein;

B) an oxidizer that produces free radicals when contacted by said coated abrasive, e.g., a per-type oxidizing agent, preferably hydrogen peroxide; and C) low levels of a dihydroxy enolic compound, e.g., ascorbic acid or derivative thereof, possess high stability (and resultant long shelf-life) with regard to maintaining near constant levels of components over long periods and consequently maintaining propensity for affording high removal rates over long periods in comparison to otherwise identical compositions without ascorbic acid (or a derivative thereof)

being present. By "Fenton's reaction metal" we mean those metal ions which react with certain oxidizers, particularly with peroxides such as hydrogen peroxide, to produce oxygen-containing free radicals such as a hydroxyl radical. Depending on the slurry (and oxidizer) used, suitable metals may include one or more of Cu, Fe, Mn, Ti, W, Ag, and V. The Fenton's metal must be active, and is preferably not in the form of an oxide, but is rather in the form of an ion absorbed onto the surface of the abrasive. Generally, the two Fenton's reaction metals most useful for modifying the surface of an abrasive are iron and/or copper, with iron being preferred. By low levels we mean less than 0.5%, preferably less than 0.2%, for example less than 0.1%, or alternately between about 20 ppm and about 500 ppm at point of use. A specific preferred embodiment comprises between about 100 ppm and about 400 ppm ascorbic acid, for example about 150 to about 250 ppm, in a slurry comprising an abrasive modified with a Fenton's reagent metal coated on the surface thereof, e.g., a boron-iron-surface-modified silica, where the total amount of iron in the slurry at point of use is between about 1 ppm and about 40 ppm, preferably between about 2 ppm and about 30 ppm, for example between about 3 ppm and about 20 ppm iron, disposed on the between about 0.1% and about 5%, for example 0.3% to about 2% by of abrasive, e.g., boron-surface-modified silica. Additionally, it has been found that such CMP polishing compositions are effective in reducing iron ion contamination on the polished surface of wafers. This effect is surprising because 1) there is so little ascorbic acid present, and 2) ascorbic acid is generally considered, especially at concentrations below 0.1%, to be non-chelating. Surprisingly, ascorbic acid is as good as or superior to chelators in reducing iron ion contamination of wafers. As ascorbic acid (or a derivative thereof) removes metal contamination during polishing, this eliminates additional cleaning or buffing steps during the fabrication of semiconductor devices.

It has been found that aqueous CMP polishing compositions comprising or consisting essentially of:

A) a soluble metal oxidizer or polishing accelerator (preferably a Fenton's reaction metal and/or rare earth metal such as cerium) in an amount below 0.4%, preferably below about 0.1%, more preferably below 0.05% (by weight of the soluble metal);

B) a per-type oxidizing agent, preferably hydrogen peroxide;

C) optionally an abrasive; and

D) a dihydroxy enolic compound, e.g., ascorbic acid or derivative thereof, possess high stability (and resultant long shelf-life) with regard to maintaining near constant levels of components over long periods and consequently maintaining propensity for affording high removal rates over long periods in comparison to otherwise identical compositions without ascorbic acid (or a derivative thereof) being present. Generally, industry is moving toward inclusion of very low levels, e.g., between about 0.004% to 0.01% of soluble metal ions. In such compositions, the dihydroxy enolic compounds should be present in an amount typically less than 1%, for example less than 0.2%, or alternately between about 100 ppm and about 1000 ppm at point of use. Additionally, it has been found that such CMP polishing compositions are effective in reducing iron ion contamination on the polished surface of wafers. This effect is surprising because 1) there is so little ascorbic acid present, and 2) ascorbic acid is generally considered, especially at concentrations below 0.1%, to be non-chelating. Surprisingly, ascorbic acid is as good as or superior to chelators in reducing iron ion contamination of wafers. As ascorbic acid (or a derivative thereof) removes metal contamination during polishing, this eliminates additional cleaning or buffing steps during the fabrication of semiconductor devices.

It has been found that aqueous CMP polishing compositions comprising or consisting essentially of:

A) a soluble metal oxidizer or polishing accelerator (e.g., soluble transition metal(s) and/or soluble rare earth metal(s) such as cerium) in an amount below 0.4%, preferably below about 0.1%, more preferably below 0.05% (by weight of the soluble metal);

B) optionally an abrasive; and

C) a dihydroxy enolic compound, e.g. ascorbic acid or derivative thereof, possess high stability (and resultant long shelf-life) with regard to maintaining near constant levels of components over long periods and consequently maintaining propensity for affording high removal rates over long periods in comparison to otherwise identical compositions without ascorbic acid (or a derivative thereof) being present. Generally, a CMP composition requires between about 0.004% to 0.4% of soluble metal ions when there is no additional organic oxidizers present. In such compositions, the dihydroxy enolic compounds should be present in an amount typically less than 1%, for example less than 0.2%, or alternately between about 100 ppm and about 1000 ppm at point of use. Additionally, it has been found that such CMP polishing compositions are effective in reducing iron ion contamination on the polished surface of wafers. This effect is surprising because 1) there is so little ascorbic acid present, and 2) ascorbic acid is generally considered, especially at concentrations below 0.1%, to be non-chelating. Surprisingly, ascorbic acid is as good as or superior to chelators in reducing iron ion contamination of wafers. As ascorbic acid (or a derivative thereof) removes metal contamination during polishing, this eliminates additional cleaning or buffing steps during the fabrication of semiconductor devices.

By abrasive we mean a member selected from the group consisting of one or more of alumina, titania, zirconia, germania, silica, ceria, spinels, iron oxides, copper oxides, and or any other solid materials capable of abrading a surface. Silica is the preferred abrasive. Due to stringent purity requirements in the integrated circuit industry, the preferred metal oxide should be of a high purity. High purity means that the total impurity content, from sources such as raw material impurities and trace processing contaminants, is typically less than 1% and preferably less than 0.01% (i.e., 100 ppm). The abrasive may consist of discrete, individual particles having discrete particle diameters from 5 nanometers to about 2 microns, preferably 10 nanometers to 500 nanometers, more preferably from 20 nanometers to 150 nanometers. By the term "diameter" we mean the mean particle diameter as determined by the average equivalent spherical diameter when using TEM image analysis, i.e., based on the area of the particles which is converted to a circle and then the diameter is determined. Advantageously, the surface-modified abrasive particles are of substantially one size, e.g., a slurry described as containing iron-boron-surface-modified silica having a diameter of 50 nanometers advantageously has few or no iron-boron-surface-modified silica particles greater than about 70 nanometers, e.g., less than 5% by weight based on the weight of the iron-boron-surface-modified silica would have a diameter greater than about 70 nanometers. Generally, the particle size is not important, except that larger particles provide faster rates but higher defect levels than do smaller particles. The particles are advantageously round (spherical) or oval. Colloidal silica is the most preferred abrasive.

Advantageously the surface of the abrasive is at least partially modified with a stabilizer. The term "stabilizer" as it pertains to abrasive particles means an agent effective to help maintain the abrasive as a sol in an aqueous medium. Suitable stabilizers include metal ions absorbed onto the surface of the abrasive, such as, boron, aluminum tungsten, and titanium, with boron and aluminum being preferred. The most preferred stabilizer is boron, advantageously provided from boric acid, and we call a particle so treated a boron-surface-modified abrasive.

The surface coverage of the surface modified abrasive can be characterized using zeta potential measurement. For example, the amount of surface coverage of boric acid on the silica surface can be measured using a Colloidal Dynamics instrument, manufactured by Colloidal Dynamics Corporation, 11-Knight Street, Building E8, Warwick, R.I., 02886. The Colloidal Dynamics instrument measures the zeta potential (surface charge) of the surface modified silica particles. During the preparation of boric acid modified silica, boric acid is added to the deionized silica particles, which changes the zeta potential of the silica particle surface. After reaching the full surface coverage, there is no change in the zeta potential of the surface modified silica with continued addition of boric acid. From this titration curve of zeta potential as a function of grams of boric acid to a given amount of silica, it is possible to measure the percent surface coverage of boric acid on the silica surface.

The slurries of the present invention may optionally further comprise an iron-modified silica as described in published U.S. Applications 20040029495, 20040006924, and 20030162398, or a boron-iron-modified silica.

Additionally, inclusion of one or more of the following compounds may increase free radical production when exposed to ultrasound and a metal: phosphonoformic acid, phosphonoacetic acid, and pyrophosphoric acids, or metal-free salts thereof. Such compounds can be in a CMP composition at concentrations between about 0.001% and about 1%.

The oxidizing agent is advantageously monopersulfate, a persulfate, a peroxide, a periodate, a peroxy or mixtures thereof. More preferably, the oxidizing agent comprises at least one of periodic acid, hydrogen peroxide and urea-hydrogen peroxide, with hydrogen peroxide being most preferred Generally, the slurry comprises between 0.1% and 10%, typically between 1% and 5%, of oxidizer, e.g., hydrogen peroxide, between 0.1% and 6%. The pH of the compositions of this invention is not limited and can be chosen to be that corresponding to an acidic, a basic, or a neutral value. The pH of the composition is advantageously between about 3 and 8.

A preferred slurry comprises 0.3% to 5%, preferably 1-2%, of boron-surface-modified Colloidal Silica; 0.0005% to 0.02%, preferably 0.002% to 0.006% of soluble iron; from about 0.005% to about 0.2%, preferably from about 0.01% to about 0.08% ascorbic acid or derivative thereof, about 1% to about 8%, preferably between about 3% and about 5%, of hydrogen peroxide, and a balance water. Optionally, the slurry can further comprise between about 0.005% and about 0.4%, preferably between about 0.05% to 0.2%, of a chelator, e.g., lactic acid and/or citric acid.

This invention provides compositions and methods that are particularly useful for CMP of metal-containing substrates, including tungsten-containing substrates, copper-containing substrates, titanium-containing substrates, titanium-nitride containing substrates, tantalum-containing substrates, tantalum-nitride containing substrates, and other substrates associated with integrated circuits, thin films, semiconductors, and wafers. Traditional CMP procedures can be utilized, including adhering some or all of the abrasive material onto the polishing pad. The associated methods of this invention comprise the use of the aforementioned compositions for polishing substrates. Typically, a substrate (e.g., a wafer) is placed face-down on a polishing pad which is fixedly attached to a rotatable table of a polisher. In this manner, the substrate to be polished is placed in direct contact with the polishing pad. A wafer carrier system or polishing head is used to hold the substrate in place and to apply a downward pressure against the backside of the substrate during CMP processing while the table and the pad are rotated. The polishing composition (e.g., CMP slurry) is applied (usually continuously) on the pad during CMP processing to effect the removal of material to (at least partially) planarize the substrate.

The polishing method may include subjecting the slurry to ultrasound and/or electrochemical energy as described in U.S. Pat. No. 6,692,632 and in published U.S. Application 2003/0082101 to further increase the production of hydroxyl radicals.

Advantageously, if used to polish tungsten, the tungsten removal rate is greater than 300 Å/min, preferably greater than 4000 Å/min, and is typically between 5000 and 7000 Å/min. As is known in the art, the removal rate can be varied by a number of factor. The composition and associated methods of this invention are particularly useful and preferred for tungsten CMP and afford very high selectivities for removal of tungsten in relation to dielectric (as illustrated in the examples). In certain embodiments, the selectivity for removal of tungsten relative to removal of the dielectric from the substrate is at least 15:1, typically at least 20:1, and advantageously at least 30:1. Selectivity of tungsten to titanium nitride is at least 3:1, typically at least 4:1, and advantageously at least 5:1.

The preferred additives useful in the practice of this invention include dihydroxy enolic compounds (defined here as enolic compounds having an alpha hydroxy and a beta hydroxy disposed on two carbon atoms on one side of the C=O functionality, or less preferably enolic compounds having an alpha hydroxy and alpha hydroxy dispose on the carbon atoms immediately adjacent to the C=O functionality). Preferred dihydroxy enolic compound include ascorbic acid ac derivatives thereof. Accordingly, "ascorbic acid derivatives" include, but are not limited to esters, ethers, and salts of ascorbic acid. Particularly suitable are esters formed between a carboxylic acid and the primary hydroxyl group of the glycol moiety of ascorbic

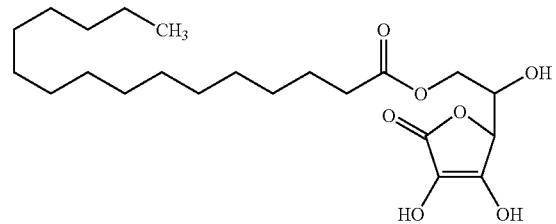

acid, as shown in the structure above. Any C1-C24 carboxylic acid can be used to form the ester. In one embodiment, the carboxylic acid is a fatty acid. The term fatty acid, as used herein, means a saturated or unsaturated, straight chain or branched C8-C24 carboxylic acid. In one embodiment, the fatty acid is a C8-C18 carboxylic acid. In one embodiment, the fatty acid is a C10-C18 carboxylic acid. Representative C8-C22 carboxylic acid include, but are not limited to, caproic acid, lauric acid, myristic acid, palmitic acid, stearic acid, palmic acid, oleic acid, linoleic acid, and linolenic acid. Palmitic acid esters are particularly useful. Suitable salts of ascorbic acid include, but are not limited to, ammonium salts or other amine salts. Any ether of ascorbic acid can be used in the compositions and methods of the invention. Typically, the ethers having a C1-C24 alkyl group attached to one or more hydroxyl groups of the ascorbic acid. In one embodiment, the ether is formed at the primary hydroxyl group of the glycol moiety of ascorbic acid. Representative derivatives of ascorbic acid include, but are not limited to, ascorbic palmitate; dipalmitate L-ascorbate; or ammonium L-ascorbate-2-sulfate. In one embodiment, the ascorbic acid derivative is ascorbic palmitate, as shown in the structure above.

We believe the CMP composition having more than about 10 ppm of soluble transitional metal ions and/or soluble rare earth metal ions at point of use should comprise a minimum of about 0.0005 moles, preferably more than 0.001 moles per liter of the dihydroxy: enolic compounds at point of use. An alternate minimum is the CMP composition should comprise twice as many moles of the dihydroxy enolic compounds as there will be soluble transitional metal ions and/or soluble rare earth metal ions at point of use after polishing. Generally, economics rather than science provide a more effective cap on the maximum amount of dihydroxy enolic compounds present in a CMP composition, but there is little need nor additional benefit to be gained by having more than twenty times twice as many moles of the dihydroxy enolic compounds as there will be soluble transitional metal ions and/or soluble rare earth metal ions at point of use after polishing. A more realistic maximum is between about three to about six times twice as many moles of the dihydroxy enolic compounds as there will be soluble transitional metal ions and/or soluble rare earth metal ions at point of use after polishing.

Ascorbic acid, ascorbic palmitate, and other substituted ascorbic acids are unique enolic metal quenchers with two hydroxyl attached to an olefinic double bonds. Ascorbic acid works to reduce ferric ion defectivity on the polished tungsten wafer surface in CMP formulations containing ascorbic acid. Interestingly use of metal complexes of dihydroxy enols such as ascorbic acid complex of iron on boron modified silica is not reported for the activation of hydrogen peroxide.

The olefinic bond stabilizes the peroxy radical for the stabilization of hydrogen peroxide in the slurry formulation. This approach of adding ascorbic acid gives slurry pot life with H2O2 exceeding more than two weeks.

Iron attached to boron modified silica can not be pulled out using ascorbic acid whereas ascorbic acid pulls out iron from the ferric ion attached to silica in W3710 formulation. A simple answer may be because boric acid ligand is a stronger base than silicon-oxygen ligand (electronegativity difference between boron oxygen vs silicon-oxygen bond)). Also, Si—O—Si—O— bond length is greater than —O—B—O—B—O— as boron atom has much smaller radius than silicon, so iron is ionically more tightly attached on the boron-oxygen surface as they are in closer proximity.

We have found that polishing with abrasives leaves metal residue. While having iron bound to the surface of the abrasive particles, as opposed to iron ions in solution, reduces transition metal, (e.g., iron) contamination of the substrate dielectric material considerably compared to the contamination remaining after polishing with soluble metal catalyst, polishing with iron coated (iron-surface-modified) silica still leaves appreciable iron residue on the substrate. Polishing under substantially identical conditions with an iron-coated silica slurry as described in the above applications left iron residues on a wafer at ~5 times $10^{-10}$ atoms/cm$^2$. While this was about 20 times less than the contamination caused by the soluble iron-catalyzed slurry, greater improvements could be made. Some improvement is seen with polishing with boron-iron-surface-modified silica leaves iron residue on the substrate. Soluble metal ions leave a lot of contamination. Generally, between about 100 ppm and about 5000 ppm ascorbic acid, or a similar number of moles of other alpha,beta dihydroxy enolic compounds, will significantly reduce iron ion contamination of substrates, where the source of the ions are soluble metal ions in the CMP composition, ions abraded or reacted from an active abrasive, e.g., iron oxide abrasive, an iron-surface-modified silica, or a boron-iron-surface-modified silica, or any combination therein. Advantageously, the substrate surface can be cleaned after polishing with a cleaner also comprising between about 100 ppm and about 5000 ppm ascorbic acid or similar molarity of alpha,beta dihydroxy enolic compounds, but it is anticipated that incorporating the alpha,beta dihydroxy enolic compounds in the polishing composition as opposed to in a post polish cleaner will have greater effect, as the alpha,beta dihydroxy enolic compounds in the polishing composition are aided by the oxidizers and abrasives in the CMP formulation in removing metal ions from a integrated circuit surface.

Generally, dielectrics are polished with ceria abrasives. Recently, some inventors have discussed polishing some metals, e.g., noble metals, with slurries comprising ceria and/or soluble cerium salts (or other rare earth salts). Polishing with ceria leaves considerable cerium ion contamination, though not as much as if soluble cerium salts are also included. Polishing of dielectrics can also benefit from the presence of between about 50 to about 5000 ppm ascorbic acid or similar molarity of alpha,beta dihydroxy enolic compounds. Processes that can beneficially use such polishes include shallow trench isolation (STI) polishing and pre-metal dielectric polishing. We have found ascorbic acid removes even tightly bound metal from the surface of dielectrics, and incorporating ascorbic acid in any slurry comprising ceria abrasive and/or cerium salts is advantageous. Generally, between about 50 ppm and about 5000 ppm ascorbic acid, or a similar number of moles of other alpha,beta dihydroxy enolic compounds, will significantly reduce cerium ion contamination of substrates, where the source of the ions are soluble metal ions in the CMP composition, ions abraded or reacted from an active abrasive, e.g., ceria, or both. Of course, if an active abrasive comprises other rare earth metals, and/or other transitional metals besides iron, the same ascorbic acid or other alpha, beta dihydroxy enolic compounds, will significantly reduce rare earth ion and/or transitional metal ion contamination of substrates.

EXAMPLES

All percentages are weight percentages and all temperatures are degrees Centigrade unless otherwise indicated. The following terms are used throughout the application:
Å: angstrom(s)—a unit of length
CMP: chemical mechanical planarization, or chemical mechanical polishing
min: minute(s)
ml: milliliter(s)
mV: millivolt(s)
psi: pounds per square inch
rpm: revolutions per minute
Parts per million, or "ppm" is part by weight per million parts of the slurry or slurry concentrate.
PETEOS mean Plasma enhanced deposition of tetraethoxy silane, which is a known low-k dielectric oxide layer.

"W:TiN Sel" or "W:TiN Selectivity" is the ratio of the amount (depth) of tungsten removed from a wafer to the amount (depth) of titanium nitride removed during CMP experiments under identical conditions.

"W:PETEOS Sel" or "W:PETEOS Selectivity" is the ratio of the amount (depth) of tungsten removed to the amount (depth) of PETEOS (dielectric material) removed during CMP experiments under identical conditions, "Blanket wafers" are those that have typically one type of surface prepared for polishing experiments. These are either CVD deposited tungsten, titanium nitride, and PETEOS.

Commercial sources of various reagents and consumables used in the Examples include the following:

Iron-boron-surface-modified colloidal silica: DuPont Air Products NanoMaterials L.L.C., 2507 West Erie Drive, Tempe, Ariz., 85282

Iron-surface-modified colloidal silica: DuPont Air Products NanoMaterials L.L.C., Tempe. Ariz., 85282

Ascorbic acid: Aldrich Chemical Company Inc, 1001 West St. Paul, Milwaukee, Wis., 53233.

Ascorbic acid palmitate: Aldrich Chemical Company, Inc, Milwaukee, Wis., 53233.

Ferric nitrate hydrate: Aldrich Chemical Company, Inc, Milwaukee, Wis., 53233.

Boric acid: Aldrich Chemical Company, Inc, Milwaukee, Wis., 53233; or Fisher Scientific, 2000 Park Lane, Pittsburgh, Pa., 15275

Colloidal silica, Syton HT50: DuPont Air Products NanoMaterials L.L.C., Tempe, Ariz., 85282.

Ion exchange resin IRC-120: Aldrich Chemical Company, Milwaukee, Wis., 53233.

Commercial sources of various materials and instruments used in the Examples include the following:

The blanket wafers used in this work were purchased from Silicon Valley Microelectronics, 1150 Campbell Ave, CA, 95126. The film thickness specifications are:

PETEOS: 15,000 Å on silicon

Tungsten: 10,000 Å CVD/5000 Å thermal oxide on silicon

Titanium nitride: 3000 Å TiN/3000 Å thermal oxide

IC1010™ Pad Rohm and Haas Electronic Materials IC1010™ pads were used for polishing. The IC1010™ pad consists of a rigid microporous polyurethane with a radial grooving pattern top pad and a Suba™ IV impregnated felt sub-pad. Rohm and Haas Electronic Materials is based in Newark, Del.

Methodology and commercial sources of various instruments used in the Examples include the following.

Metrology: PETEOS thickness was measured with a Nanometrics, model, #9200, manufactured by Nanometrics Inc, 1550 Buckeye, Milpitas, Calif. 95035-7418. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion. Planarity measurements were conducted on a P-15 Surface Profiler manufactured by KLA® Tencore, 160 Rio Robles, San Jose, Calif. 95161-9055.

Polishing experiments were conducted using CVD deposited tungsten, titanium nitride, and PETEOS wafers. The CMP tool that was used is a Mirra®, manufactured by Applied Materials, 3050 Boweres Avenue, Santa Clara, Calif., 95054. A Rohm and Haas Electronic Materials IC1010™ pad, supplied by Rohm and Haas Electronic Materials, 3804 East Watkins Street, Phoenix, Ariz., 85034, was used on the platen for the blanket wafer studies.

Zeta potential measurements were made using a Colloidal Dynamics instrument, manufactured by Colloidal Dynamics Corporation, 11 Knight Street, Building E8, Warwick, R.I. 02886. This instrument measures the zeta potential (surface charge) of colloidal particles, such as surface-modified colloidal silica particles.

EXAMPLES

Example/Comparative Example 1

This example shows that modest gains in polishing rate can be achieved, under certain conditions, when a small amount of chelator is added to a slurry. In this case, Lactic Acid was added to a slurry in amounts between 0 and 0.5%. The slurry contained 4% peroxide and a mixture of iron-surface-modified silica and regular silica. Experimental conditions were: down force 5 psi, back pressure 2.5 psi, Ring pressure 5.5 psi, table rotation 110 RPM, carrier rotation 105 RPM, 150 ml/min slurry flow, using Strasbaugh 6EC polisher, Rodel IC1000/SUBA IV pad, and Rodel DF200 Carrier film, mix ratio 4/0.3/0.6, pH adjusted to 3.4. It can be seen that the slurries having more than zero but less than 0.5% lactic acid provided faster tungsten removal rates than either the slurry with no chelator or the slurry with 0.5% chelator.

| Lactic acid | Angstroms/min |
| --- | --- |
| 0 | 4060 |
| 0.1% | 4300 |
| 0.3% | 4380 |
| 0.5% | 3710 |

This was not a function of the chelator increasing the efficiency of the iron. The iron remained bound to the surface of the silica, and its activity was invariant regardless of the presence of the chelator. Increases in the rate of metal removal are modest, e.g., less than 10%. The chelator in this case is believed to have increases metal removal rates by merely solvating and carrying away tungsten ions polished from the surface, which otherwise would adhere to the surface in view of the very poor solubility of tungsten in water.

Comparative Example 2

Preparation of iron-boron-surface-modified colloidal silica particles starting with sodium stabilized colloidal silica having an average particle size of 40 to 55 nanometers, with substantially no soluble metal oxidizers present. The following a procedure was used for the preparation of boron-coated silica was substantially as described in U.S. Pat. No. 6,743,267, the disclosure of which is incorporated herein by reference.

Preparation of boron surface-modified silica: Approximately 1 kg of AMBERLITE IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded an acidic form of resin.

SYTON® HT 50 (12 kg, approximately 2.27 gallons, DuPont Air Products NanoMaterials L.L.C., Tempe, Ariz.) was placed in a five-gallon mix tank equipped with an agitator. 2.502 kg of deionized water was added to the tank and the solution was allowed to mix a few minutes. The pH of the solution was measured to be approximately 10.2. With continued pH monitoring, small amounts of acid-state resin were added, while allowing the pH to stabilize in between additions. Additional resin was added in small portions until the pH had dropped to pH 1.90-2.20. Once this pH limit had been reached and was stable in this range, no further resin additions were made and the mixture was stirred for 1-1.5 hours. Subsequently, the mixture was passed through a 500-mesh screen to remove the resin and afforded deionized SYTON HT 50.

A solution of 268 g of boric acid powder (Fisher Scientific, 2000 Park Lane, Pittsburgh, Pa., 15275) in 5.55 kg of deionized water was prepared in a 10 gallon mixing tank equipped with an agitator and a heater by slowly adding the boric acid powder until all had been added to the water and then agitating the mixture for 5 minutes and increasing the temperature of the mixture to 55-65° C. Deionized and diluted SYTON HT 50 (14.5 kg) was then added to the boric acid solution slowly over about 1.2 hours by adding it at approximately 200 ml/minute and maintaining the temperature greater than 52° C. while agitating the mixture. After this addition was completed, heating at 60° C. and agitation of the mixture were continued for 5.5 hours. The resulting solution was subsequently filtered through a 1-micron filter to afford boron surface-modified colloidal silica.

This boron surface-modified colloidal silica was characterized for colloid stability over 15 days using a Colloidal Dynamics instrument (11-Knight Street, Building E8, Warwick, R.I., 02886), and was found to exhibit both constant pH (pH approximately 6.6) and zeta potential (zeta potential approximately −58 millivolts) over the 15-day test period. The percentage of surface sites of this surface-modified colloidal silica occupied by boron-containing compound(s) was approximately 98%.

The boron-surface-modified silica was used to prepare iron-boron surface-modified silica in a polishing formulation. Components of 1 kilogram of the polishing composition included water and the following:
1) Boron surface-modified colloidal silica (30% solids)= 43.5 grams
2) Nitric acid=30 PPM.
3) De-ionized water=823 grams
4) Ferric nitrate hydrate=38 ppm
5) Hydrogen peroxide (30%)=133.3 grams Procedure for mixing the slurry, 1.0 kg batch size was as follows. In a 2-liter beaker, 823 grams of de-ionized water were transferred. After adding water to the beaker, it was kept under agitation using a magnetic stirrer. Under agitation, 43.5 grams of boron surface-modified silica was added slowly during a period of three minutes. After completing the addition of the boron surface-modified colloidal silica, 38 ppm ferric nitrate hydrate was added to the abrasive mixture under agitation to prepare iron-boron-surface-modified colloidal silica. The mixture was stirred for 10 additional minutes, followed by the addition of 133.3 grams of hydrogen peroxide during a period of 4 minutes. The mixture was agitated for additional 4 minutes. After 4 minutes of agitation, under agitation, 30 ppm of 30% nitric acid was added. After stirring the mixture for 4 minutes, the pH was 4.7, and the zeta-potential −39.3 mV. The slurry contained 7.6 ppm iron, substantially all of which was absorbed onto the iron-boron-surface-modified silica.

This slurry was then used for determining tungsten and titanium nitride removal rates at time zero; with no ascorbic acid and substantially no soluble metal oxidizers present. For polishing experiments, a Mirra® polishing tool, manufactured by Applied Materials, 3050 Bowers Avenue, Santa Clara, Calif., 95054, was used. The polishing compositions were used to polish CVD tungsten blanket wafers, titanium nitride blanket wafers, and PETEOS blanket wafers. The polishing conditions on the Mirra® were set as follows:

Flow rate of polishing composition=120 ml/min (milliliters per minute)
Retaining ring=6.8 psi
Membrane pressure=3.5 psi
Inner tube=6.3 psi
Platen speed=120 rpm
Head speed=130 rpm The substrate was effectively planarized using the above polishing composition under the stated conditions. The tungsten removal rates, titanium nitride removal rates, PETEOS removal rates, selectivity of tungsten to titanium nitride, and selectivity of tungsten to PETEOS are shown in Table 1 (Example 2.)

Example 3

Tungsten and Titanium Nitride Removal Rates at Time Zero; 200 ppm Ascorbic Acid Added, Substantially No Soluble Metal Oxidizers Present In Example 3, the formulation was same as Example 2, the only difference being the addition of 200 ppm of ascorbic acid at the last step during the preparation of the polishing formulation. Polishing experiments were conducted at time zero as done for the control in Example 1. The substrate was effectively planarized using the above polishing composition under the stated conditions in Example 2. The tungsten removal rates, titanium nitride removal rates, PETEOS removal rates, selectivity of tungsten to titanium nitride, and selectivity of tungsten to PETEOS are shown in Table 1 (Example 3.)

The iron-modified-boron-modified silica was found to retain the bound iron ions, and therefore there was essentially no soluble iron ions in solution.

Comparative Examples 4 and 5

24 Hours Aging, Substantially no Soluble Metal Oxidizers Present

The polishing compositions were prepared using the procedure described in Examples 2 and 3, respectively, except the slurries were aged 24 hours before polishing tests were done. In comparative Example 4, the formulation was same as Example 2 (no ascorbic acid) whereas Example 5 contained 200 ppm ascorbic acid. The formulations in comparative Examples 4 and 5 were aged for 24 hours. After 24 hours aging, the slurry formulations were used for polishing experiments using the same conditions as described in Examples 2 and 3. The substrate was effectively planarized using the above polishing composition under the stated conditions. The tungsten removal rates, titanium nitride removal rates, PETEOS removal rates, selectivity of tungsten to titanium nitride, and selectivity of tungsten to PETEOS are shown in Table 1 (Examples 4 and 5.)

Comparative Example 6 and Example 7

Six Day Aging

In comparative Example 6 and Example 7, the polishing compositions were prepared using the procedure described in Examples 2 and 3, respectively, however, the samples were aged for six days. After six days aging, the polishing formulations were used to polish tungsten, titanium nitride, and PETEOS wafers. The tungsten removal rates, titanium nitride removal rates. PETEOS removal rates, selectivity of tungsten to titanium nitride, and selectivity of tungsten to PETEOS results are summarized in Table 1 (Examples 6 and 7.)

Results for Examples 2-7 are summarized in Table 1, which include tungsten removal rates, titanium nitride removal rates and PETEOS removal rates. In Table 1, clearly the polishing results suggest that Examples 2 and 3 at zero time show similar tungsten removal rates. It can be seen that addition of even a trace of ascorbic acid, e.g., 200 ppm, resulted in a decline in the Selectivity of tungsten to titanium nitride, from 6.3 to 4.4, and in the Selectivity of tungsten to TEOS, from 35 to 26. Addition of ascorbic acid seem to increase titanium nitride removal rate.

After 24 hour aging, for comparative Example 4 with no ascorbic acid, tungsten removal rate dropped from 6590 Å/min (at time zero) to 5856 Å/min, a drop in rate of approximately 730 Å/min (11%), whereas for Example 5 with 200 ppm ascorbic acid, the tungsten removal rate dropped only 194 Å/min (3%). After six days aging, for comparative Example 6 with no ascorbic acid, tungsten removal rate dropped from 6590 Å/min to 3832 Å/min, a drop of 2700 Å/min (over 40%). In contrast, for Example 7 with 200 ppm ascorbic acid, tungsten removal rate dropped from 6430 Å/min to 5479 Å/min, a drop of 951 Å/min (under 15%). The increase in stability given by only 200 ppm ascorbic acid extends shelf life of product and reduces the need for manufacturers to change process times to account for the age of the slurry.

Another advantage of ascorbic acid addition was in maintaining a consistent titanium nitride removal rate from time zero to six days. For instance, for comparative Examples 2, 4, and 6, titanium nitride removal rate dropped from 1037 Å/min to 917 Å/min whereas the Examples with 200 ppm ascorbic acid (Examples 3, 5, and 7) maintained consistent titanium nitride removal rates between 1458 (zero time) to 1519 Å/min.

TABLE 1

Effect of Ascorbic acid on Ferric Ion concentration After Polishing Tungsten Wafers, and Comparison with Acetic acid, Defectivity Data as Measured on TEOS Wafers

|  | Example, 1: Boron modified silica coated with 3.6 PPM of ferric ions, no ascorbic acid | Example, 2: Boron modified silica coated with 7.6 PPM of ferric ions, no ascorbic acid | Example, 3: Boron modified silica coated with 7.6 PPM with 200 PPM ascorbic acid | Example, 4 Boron modified silica coated with 7.6 PPM with 200 PPM acetic acid | Example, 5 Boron modified silica coated with 7.6 PPM with 800 PPM of acetic acid |
|---|---|---|---|---|---|
| Boron coated colloidal silica (30 wt %.) | 43.5 g | 43.5 g | 43.5 g | 43.5 g | 43.5 g |
| Zeta potential of colloidal silica | −92.3 mV | −39.3 mV | −39.9 mV | −39.9 mV | −39.9 mV |
| Ferric nitrate, nonaohydrate | 16 PPM | 38 PPM | 38 PPM | 38 PPM | 38 PPM |
| $H_2O_2$ (wt %.) | 133.3 g | 133.3 g | 823 g | 823 g | 823 g |
| Water (wt. %) | 823 g | 823 g | 94.65 | 94.65 | 94.65 |
| pH | 4.7 | 3.9 | 3.8 | 3.8 | 3.8 |
| Defectivity: Ferric ion concentration on the polished wafer, E10 A/cm2, where A is the number of counts of iron contamination | 81.4 | 205 | 13.2 | 212 | 188 |

Effect of Ascorbic acid on the Stabilization of H2O2 in the Presence of Iron-Boron surface-modified Silica During Chemical Mechanical Planarization of Tungsten and Titanium (1.0 Kg batch size)

|  | Example, 2: Control experiment, iron-boron surface modified silica, 7.6 ppm of ferric ion silica surface, Zero time | Example, 3: 200 ppm Ascorbic acid, boron-iron surface modified silica, 7.6 ppm of ferric ion on silica surface, Zero time | Example, 4: Control experiment, No Ascorbic acid, iron-boron surface modified silica, 7.6 ppm of ferric ion on silica surface, 24 hours | Example, 5 200 ppm Ascorbic acid iron-boron surface modified silica, 7.6 ppm of ferric ion on silica surface, 24 Hours |
|---|---|---|---|---|
| Boron surface-modified colloidal silica (30% wt.) | 43.5 g | 43.5 g | 43.5 g | 43.5 g |
| Zeta potential of colloidal silica | −39.3 mV | −39.3 mV | −39.3 mV | −39.3 mV |
| Ferric nitrate, hydrate | 38 ppm | 38 ppm | 38 ppm | 38 ppm |
| Ascorbic acid | 0 ppm | 200 ppm | 0 ppm | 200 ppm |
| $H_2O_2$ (30 wt %.) | 133.3 g | 133.3 g | 133.3 g | 133.3 g |
| Water (wt. %) | 823 g | 823 g | 823 g | 823 g |
| pH | 3.9 | 4.1 | 4.1 | 3.8 |
| Removal rate of Tungsten (Å/min) | 6590 | 6430 | 5856 | 6236 |
| Removal rate of TEOS (Å/min) | 189 | 249 | 168 | 210 |

TABLE 1-continued

| | | | | |
|---|---|---|---|---|
| Removal rate of Titanium nitride (Å/min) | 1037 | 1458 | 820 | 1532 |
| Selectivity of tungsten to titanium nitride | 6.3 | 4.4 | 7.1 | 4.0 |
| Selectivity of tungsten to TEOS | 35 | 26 | 35 | 29 |

| | Example, 6: Control experiment, No Ascorbic acid, Iron-boron surface modified silica, 7.6 ppm of ferric ion on silica surface, Six days | Example, 7: 200 PPM Ascorbic acid, Iron-boron surface modified silica, 7.6 ppm of ferric ion on the silica surface, Six days |
|---|---|---|
| Boron coated colloidal silica (30 wt %.) | 43.5 g | 43.5 g |
| Zeta potential of colloidal silica | −39.3 mV | |
| Ferric nitrate hydrate | 38 ppm | 38 ppm |
| Ascorbic acid | 0 ppm | 200 ppm |
| $H_2O_2$ (wt %.) | 133.3 g | 133.3 g |
| Water (wt. %) | 823 g | 823 g |
| pH | 3.9 | 3.9 |
| Removal rate of Tungsten (Å/min) | 3832 | 5479 |
| Removal rate of TEOS (Å/min) | 135 | 184 |
| Removal rate of Titanium nitride (Å/min) | 917 | 1519 |
| Selectivity of tungsten to Titanium nitride | 917 | 3.6 |
| Selectivity of tungsten to TEOS | 28 | 30 |

Figure 2:
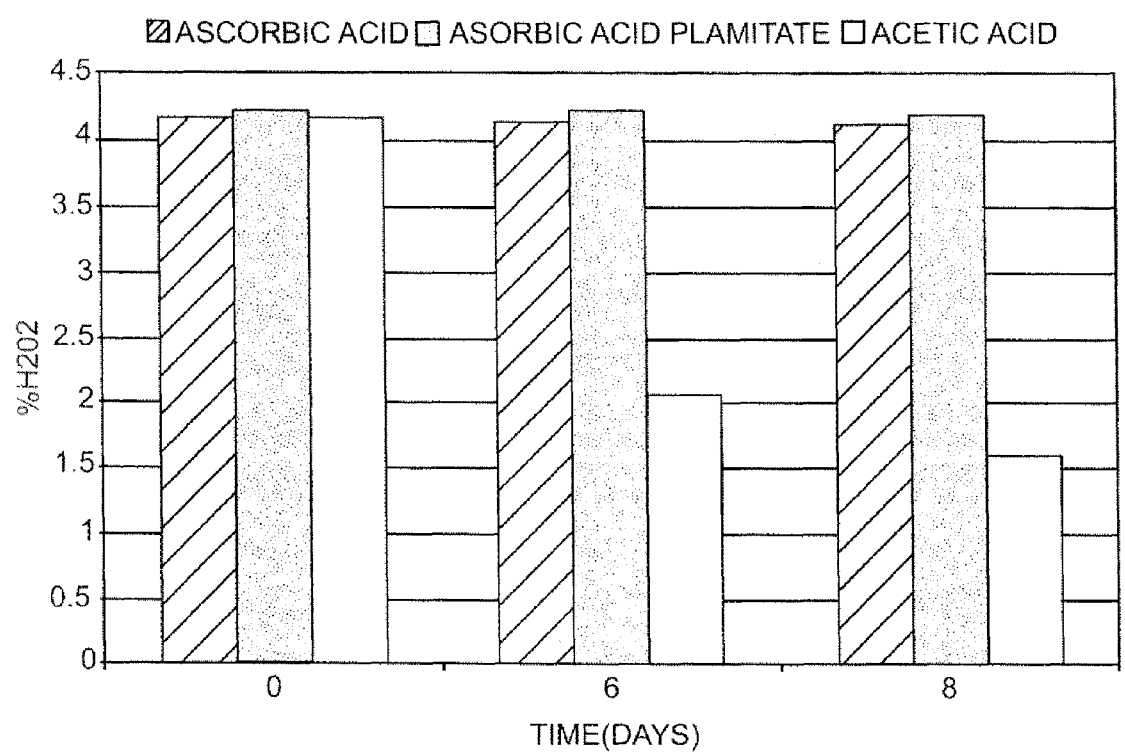
FIG. 2 is a graph showing the Stability of H2O2 in the presence of Ascorbic Acid, Ascorbic Acid Palmitate, and Acetic Acid in Polishing Formulations having boron-iron-surface-modified silica.

It is well known that tungsten and titanium nitride removal rates are sensitive to the concentration of H2O2, so in a separate set of experiments, the rate of decomposition of H2O2 with and without ascorbic acid or/and ascorbic acid derivatives in the slurry formulation was investigated. The samples were as described in the various Examples and comparative Examples, but rather than polishing, the amount of hydrogen peroxide was determined. The results are summarized in FIG. 2. Clearly the data suggest that slurry formulations with ascorbic acid and ascorbic palmitate stabilized the slurry, and there was no change in the concentration of H2O2 after 8 days. This explains as to why the addition of ascorbic acid and ascorbic acid derivatives such as ascorbic palmitate in the slurry formulations stabilized the titanium nitride and tungsten removal rates for several days.

Comparative Examples 8-9 and Example 10

Role of Ascorbic Acid in Reducing Iron Contamination on Polished Wafer Surfaces

In Comparative Examples 8-9 and Example 10, the effect of adding ascorbic acid (to polishing formulations containing hydrogen peroxide and iron-boron surface-modified colloidal silica) on iron ion contamination on the polished PETEOS wafers after polishing was investigated.

Three slurries were prepared using methods as described in Examples 2 and 3. Comparative Example 8 had Iron-Boron-surface-modified silica (3.6 ppm of ferric ions) and no ascorbic acid. Comparative Example 9 had Iron-Boron-surface-modified silica (7.6 ppm of ferric ions) and no ascorbic acid. Example 10 had Iron-Boron-surface-modified silica (7.6 ppm of ferric ions) with 200 ppm ascorbic acid. The amount of iron in the supernate was less than 1 ppm.

The slurries in Examples 8, 9 and 10 were used to polish PETEOS wafers using method as described in Example 2. After the polishing and standard post CMP cleaning with dilute ammonia solution, iron ion concentration on the polished wafer surface was measured using TXRF (X-ray fluorescence spectrometry) method. The data collected from TXRF is tabulated in Table 2, and plotted in FIG. 1.

TABLE 2

Effect of Ascorbic acid on Ferric Ion concentration After Polishing PETEOS Wafer

| | Example, 8: Iron-Boron surface modified silica coated with 3.6 ppm of ferric ions, no ascorbic acid | Example, 9: Iron-Boron surface modified silica coated with 7.6 ppm of ferric ions, no ascorbic acid | Example, 10: Iron-Boron surface modified silica coated with 7.6 ppm with 200 ppm ascorbic acid |
|---|---|---|---|
| Boron surface modified colloidal silica (30 wt %.) | 43.5 g | 43.5 g | 43.5 g |
| Zeta potential of colloidal silica | −92.3 mV | −39.3 mV | −39.9 mV |
| Ferric nitrate hydrate | 16 ppm | 38 ppm | 38 ppm |
| $H_2O_2$ (wt %.) | 133.3 g | 133.3 g | 823 g |
| Water (wt. %) | 823 g | 823 g | 94.65 |
| pH | 4.7 | 3.9 | 3.8 |
| Defectivity: Iron ion concentration on the polished PETEOS wafer, E10 A/cm$^2$, where A is the number of counts of iron contamination | 81.4 | 205 | 13.2 |

It can be seen that the amount of iron contamination on the substrate surface increases when the amount of iron in the slurry increases, even though almost all the iron is absorbed onto the surface of silica abrasive. Reducing the amount of iron absorbed on the silica to its lowest practical value is therefore advantageous. However, the effect of reducing the amount of iron in the slurry is basically linear—reducing the amount of iron in the slurry 53% reduced the iron contamination on a wafer by about 60%. In contrast, keeping the same amount of iron in the slurry, but adding 200 ppm ascorbic acid, reduced the iron contamination on the wafer by more than 93%. Clearly, ascorbic acid greatly decreased the iron contamination on the water surface from 205 ($E10/cm^2$) to 13 ($E10/cm^2$). Normal post-CMP cleaning would further reduce the metal ion contamination.

Comparative Example 11 and Examples 12-13

These examples afford comparison of the efficiency for reducing iron ion contamination on polished wafer surfaces after CMP using (i) MicroPlanar® CMP3600™ alone versus (ii) formulations derived from the addition of ascorbic acid to MicroPlanar® CMP3600™. MicroPlanar® CMP3600™ comprises an iron-surface-modified silica (no boron stabilizer). MicroPlanar® CMP3600™ is a commercially available tungsten CMP slurry from DuPont Air Products Nano-Materials L.L.C., Tempe, Ariz. The formulation modification of CMP3600™ in these examples is the inclusion of ascorbic acid to reduce the iron ion contamination level on the PETEOS wafer; after CMP and standard post CMP cleaning with dilute ammonia solution. Ascorbic acid was again shown to be efficient at reducing trace iron ion contamination on the wafer surface post CMP, although a much higher concentration of ascorbic acid was needed compared to the boron-iron-surface-modified silica-based slurry used in the previous Examples.

Ascorbic acid was added to the base slurry samples, in an amount of 0.01% for Example 12 and 0.04% for Example 13. Polishing was done using the slurries of Examples 11-13 under the following conditions:
Polish Tool used: Ebara EPO222D
Measurement Tools used:
Rigaku TXRF-3 pt (0.0; 0.50 and −50.0)
KLA Tencor SP1: 10 mm E
4 Dimension 4 point probe: 49 pt line
KLA Tencor F5x: 49 pt line
The results that were obtained are summarized below in Table 3.

wafer surface after performing CMP and standard post CMP cleaning with dilute ammonia solution. This reduction in iron ion contamination did not decrease the tungsten removal rate. Surprisingly, however, 0.01% ascorbic acid had little effect on the iron. There appears to be some minimum concentration where the amount is effective. We believe that the ascorbic acid removes a substantial portion of the iron previously bound to the MicroPlanar® CMP3600™, and the increase tendency of these solubilized ions to contaminate the substrate off-sets the benefits of small amounts of ascorbic acid.

Examples 14-15 and Comparative Example 16

Samples were made of the formulation given in Example 2 with addition of 200 ppm of ascorbic acid (Example 14), 200 ppm of ascorbic palmitate (Example 15), and 200 ppm of acetic acid (Example 17). The levels of hydrogen peroxide in the samples were measured as a function of time; data points were taken at 0 days, 6 days, and 8 days. The results obtained are plotted in FIG. 2. The results demonstrate that both ascorbic acid and ascorbic palmitate are effective in stabilizing hydrogen peroxide levels, while acetic acid is not effective.

Example 17

This example shows how a modest amount of ascorbic acid can remove tightly bound metal ions from the surface of silica (a dielectric). An aqueous composition was prepared having 1.4% of an acid stabilized 180 nm average particle size colloidal silica and 1.4% of a 50 nm average particle size iron-surface-modified colloidal silica. The level of iron on the iron-surface-modified colloidal silica was sufficient to provide ppm Fe in the slurry. Then, 2400 ppm of ascorbic acid was added and the material was allowed to age a few days. Surprisingly, the ascorbic acid removed most of the bound iron from the silica surface. The Fe in supernatant was 166 ppm, while the total Fe in the system (from aqua regia digestion) was 181 ppm. In contrast, similar experiments with boron-iron-surface-modified colloidal silica showed almost zero removal of iron from the boron-modified surface of the silica.

Example 18

A CMP composition was prepared using a composition much as was described in Example 17, but to make the CMP composition on part of the Example 17 concentrate was diluted by 5 parts of water and 0.1 parts of aqueous hydrogen

TABLE 3

| Example No./Slurry Base Formulation | Weight % Ascorbic Acid at POU | Weight % $H_2O_2$ at POU | Iron Ion contamination on PETEOS Wafer Post CMP E10A/cm2 | Tungsten Removal rate Å/min |
| --- | --- | --- | --- | --- |
| Example 11/CMP3600 ™ | 0 | 4 | 376.7 | 4010 |
| Example 12/CMP3600 ™ | 0.01 | 4 | 356.6 | 4576 |
| Example 13/CMP3600 ™ | 0.04 | 4 | 93.5 | 4147 |

Note:
POU = point-of-use; A is the number of counts of iron contamination

The amount of iron deposited on these wafers was greater than the amount of iron deposited in the previous examples. MicroPlanar® CMP3600™ has bigger abrasive material and more iron that the 7.3 ppm in the previous examples. From the results given in Table 3, it is seen that the addition of 0.04% ascorbic acid to MicroPlanar® CMP3600™ resulted in the desired (>70%) reduction in iron ion contamination of the peroxide. Surprisingly, metal removal rates were near the rates expected from using the iron-surface-modified slurry such as was used to prepare Example 17, but without adding ascorbic acid. While at least 80% of the available iron was in soluble form, the metal removal rates did not drop as much as would be expected from adding an equivalent amount of totally soluble iron to a similar slurry not having iron-surfacemodified abrasive, much less the large drop in metal removal rate expected for an equivalent amount of totally soluble iron to a similar slurry not having iron-surface-modified abrasive and a peroxide "stabilizer" as taught in the prior art.

Example 19

The data in table X show the comparison between ascorbic acid, and acetic acid. Comparative Example A is control with no acid. Examples B, C contain ascorbic acid whereas Comparative examples D and E contain acetic acid. Clearly, data show that ascorbic acid removes iron contamination whereas addition of acetic acid did not remove iron contamination from the TEOS wafer surface. The data is as plotted in Figure Y. In Figure Z, effect of acetic acid and ascorbic acid on the stabilization of H2O2 is shown; compare to acetic acid, ascorbic acid stabilizes H2O2 for more than a week whereas acetic acid is a much poorer H2O2 stabilizer.

The invention is illustrated, but not limited, by the Examples provided. While the invention has been described in detail and with reference to specific examples thereof, it will be apparent to one skilled in the art that various changes and modifications can be made therein without departing from the spirit and scope thereof.

What is claimed is:

1. A method of polishing comprising the step of movably contacting the surface of an integrated circuit substrate having a metal or metallic compound thereon with a polishing composition comprising:
   1) water;
   2) an abrasive material;
   3) a per-type oxidizer;
   4) at least one of:
      a) between about 2 ppm and about 0.4% of soluble transitional metal ion-containing polishing accelerators selected from iron ions, copper ions, or mixture thereof, or
      b) iron polishing accelerators, copper polishing accelerators, or a mixture thereof coated on the abrasive; wherein the polishing accelerators are not metal ions removed from the surface of the substrate; and
   5) an α,β-dihydroxy enolic compound present in an amount between about $6*10^{-5}$ to about $4.5*10^{-3}$ moles per liter wherein the α,β-dihydroxy enolic compound effectively chelates metal ion contaminants and thereby removes the metal ion contaminants from the substrate, wherein the α,β-dihydroxy enolic compound comprises a compound of formula 2:

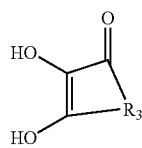

Formula 2 wherein $R_3$ is a moiety comprising between two and four linked atoms independently selected from C, O, S, P, and N having any of single and/or double bonds between adjacent atoms and the α,β-dihydroxy enolic portion can form a 5-, 6-, or 7-member ring, wherein any C, P, or N atom of the $R_3$ structure independently is optionally substituted with moieties containing between 1 and 20 atoms selected from C, O, S, P, and N in a straight chain, branched chain, or ring-containing structure having any of single and/or double bonds between adjacent atoms.

2. The method of claim 1, wherein the compound of formula 2 comprises ascorbyl palmitate.

3. The method of claim 1 further comprises an organic accelerator in an amount between about 0.005% to about 0.3%, wherein the organic accelerator forms coordination complexes with the soluble transition metal ions and increases metal or metallic compound removal rate from the substrate by a factor of at least 10% compared to the metal removal rate of an otherwise identical composition but not having the organic accelerator, where the organic accelerator does not include ninhydrin or phenacetin.

4. The method of claim 3 wherein the organic accelerator is selected from the group consisting of 2-methyl 2-hydroxypropanoic acid; 2-hydroxybutanoic acid; phenyl 2-hydroxyacetic acid; phenyl 2-methyl 2-hydroxyacetic acid; 3-phenyl 2-hydroxypropanoic acid; 2,3-dihydroxypropanoic acid; 2,3,4-trihydroxybutanoic acid; 2,3,4,5-tetrahydroxypentanoic acid; 2,3,4,5,6-pentahydroxyhexanoic acid; 2-hydroxydodecanoic acid; 2,3,4,5,6,7-hexahydroxyheptanoic acid; diphenyl 2-hydroxyacetic acid; 4-hydroxymandelic acid; 4-chloromandelic acid; 3-hydroxybutanoic acid; 4-hydroxybutanoic acid; 2-hydroxyhexanoic acid; 5-hydroxydodecanoic acid; 12-hydroxydodecanoic acid; 10-hydroxydecanoic acid; 16-hydroxyhexadecanoic acid; 2-hydroxy-3-methylbutanoic acid; 2-hydroxy-4-methylpentanoic acid; 3-hydroxy-4-methoxymandelic acid; 4-hydroxy-3-methoxymandelic acid; 2-hydroxy-2-methylbutanoic acid; 3-(2-hydroxyphenyl) lactic acid; 3-(4-hydroxyphenyl) lactic acid; hexahydromandelic acid; 3-hydroxy-3-methylpentanoic acid; 4-hydroxydecanoic acid; 5-hydroxydecanoic acid; aleuritic acid; 2-hydroxypropanedioic acid; 2-hydroxybutanedioic acid; erythraric acid; threaric acid; arabiraric acid; ribaric acid; xylaric acid; lyxaric acid; glucaric acid; galactaric acid; mannaric acid; gularic acid; allaric acid; altraric acid; idaric acid; talaric acid; 2-hydroxy-2-methylbutaned-diioic acid; agaricic acid; quinic acid; glucuronic acid; glucuronolactone; galacturonic acid; galacturonolactone; uronic acids; uronolactones; tropic acid; ribonolactone; gluconolactone; galactonolactone; gulonolactone; mannonolactone; ribonic acid; gluconic acid; citramalic acid; hydroxypyruvic acid; hydroxypyruvic acid phosphate; 4-hydroxybenzoyl formic acid; 4-hydroxyphenyl pyruvic acid; and 2-hydroxyphenyl pyruvic acid.

5. The method of claim 3 wherein the organic accelerator is an alkyne polyol.

6. The method of claim 1 wherein the polishing composition is substantially free of ascorbic acid.

7. The method of claim 1 wherein the compound of formula 2 comprises mono-, di-, tri-, or tetra-esters of ascorbic acid.

8. The method of claim 1 wherein the compound of formula 2 is selected from the group consisting of, ascorbyl palmitate, ascorbyl laureate, ascorbyl myristate, ascorbyl stearate, ascorbic acid 2-phosphate, ascorbic acid-2-phosphoric esters, ascorbic acid 2-sulfate, ascorbic acid 2-phosphonate salts, ascorbyl polypeptide, 5,6-O-isopropylpylidene-L-ascorbic acid and silylated ascorbic acid derivatives.

9. The method of claim 1 wherein the α,β-dihydroxy enolic compound of formula 2 is selected from the group consisting of 4-dihydroxymethyl-2,3-dihydroxy-cyclopent-2-enone; 4-(1,2-dihydroxy-ethyl)-2,3-dihydroxy-cyclopent-2-enone; 3,4-dihydroxy-5-hydroxymethyl-5H-furan-2-one; 3,4-dihydroxy-5-(1-hydroxy-propyl)-5H-furan-2-one; 3,4-dihydroxy-5H-thiophen-2-one; 3,4-dihydroxy-5H-furan-2-one; 2,3-dihydroxy-cyclopent-2-enone; and 3,4-dihydroxy-1,5- dihydro-pyrrol-2-one; 2,3-dihydroxy-1,4-benzenedione; 2,3-dihydroxy-1H-pyridin-4-one; 2,3-dihydroxy-thiopyran-4-one; Tetrahydroxy 1,4-benzoquinone; 2,3-dihydroxy-cyclohexa-2,5-dienone; 2,3-dihydroxy-cyclohex-2-enone; 2,3-dihydroxy-cyclohepta-2,6-dienone; 5,6-dihydroxy-1,7-dihydro-azepin-4-one, and mixtures thereof.

10. The method of polishing of claim 1 wherein the compound of formula 2 comprises erythorbic acid, one or more derivatives thereof, or mixtures thereof.

11. A method of polishing comprising the step of movably contacting the surface of an integrated circuit substrate having a metal or metallic compound thereon with a polishing composition comprising:
1) water;
2) an abrasive material;
3) a per-type oxidizer;
4) at least one of:
   a) between about 2 ppm and about 0.4% of soluble transitional metal ion-containing polishing accelerators selected from iron ions, copper ions, or mixture thereof, or
   b) iron polishing accelerators, copper polishing accelerators, or a mixture thereof coated on the abrasive;
wherein the polishing accelerators are not metal ions removed from the surface of the substrate; and
5) an $\alpha,\beta$-dihydroxy enolic compound present in an amount between about $6*10^{-5}$ to about $4.5*10^{-3}$ moles per liter wherein the $\alpha,\beta$-dihydroxy enolic compound effectively chelates metal ion contaminants and thereby removes the metal ion contaminants from the substrate, wherein the $\alpha,\beta$-dihydroxy enolic compound has a structure 1:

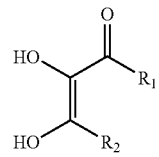

Structure 1 wherein $R_1$ and $R_2$ can each be any moiety containing between 1 and 20 atoms selected from C, O, S, P, and N in a straight chain, branched chain, or ring-containing structure, including one or more rings formed by joining $R_1$ and $R_2$ having any of single and/or double bonds between adjacent atoms.

* * * * *